(12) United States Patent
Brubaker et al.

(10) Patent No.: US 9,735,484 B2
(45) Date of Patent: Aug. 15, 2017

(54) ELECTRICAL CONNECTOR SYSTEM INCLUDING ELECTRICAL CABLE CONNECTOR ASSEMBLY

(71) Applicant: FCI AMERICAS TECHNOLOGY LLC, Carson City, NV (US)

(72) Inventors: R. Brad Brubaker, Etters, PA (US); David Humbert, Etters, PA (US)

(73) Assignee: FCI Americas Technology LLC, Carson City, NV (US)

( * ) Notice: Subject to any disclaimer, the term of this patent is extended or adjusted under 35 U.S.C. 154(b) by 0 days.

(21) Appl. No.: 14/779,373

(22) PCT Filed: Mar. 25, 2014

(86) PCT No.: PCT/US2014/031642
§ 371 (c)(1),
(2) Date: Sep. 23, 2015

(87) PCT Pub. No.: WO2014/160664
PCT Pub. Date: Oct. 2, 2014

(65) Prior Publication Data
US 2016/0056553 A1    Feb. 25, 2016

Related U.S. Application Data

(60) Provisional application No. 61/805,117, filed on Mar. 25, 2013.

(51) Int. Cl.
*H01R 25/00* (2006.01)
*H01R 12/70* (2011.01)
*H01R 12/53* (2011.01)
*H01R 12/72* (2011.01)
*H01R 43/20* (2006.01)
*H01R 12/57* (2011.01)
(Continued)

(52) U.S. Cl.
CPC ......... *H01R 12/7005* (2013.01); *H01R 12/53* (2013.01); *H01R 12/727* (2013.01); *H01R 43/205* (2013.01); *H01R 12/57* (2013.01); *H01R 12/716* (2013.01); *H05K 1/117* (2013.01); *H05K 2201/10325* (2013.01); *H05K 2201/10356* (2013.01)

(58) Field of Classification Search
CPC .. H01R 12/53; H01R 12/7005; H01R 12/727; H01R 12/57; H01R 43/205; H01R 12/716; H05K 1/117; H05K 2201/10325; H05K 2201/10356
USPC ......... 439/497, 579, 493, 76.1, 67, 499, 374
See application file for complete search history.

(56) References Cited

U.S. PATENT DOCUMENTS 4,937,707 A    6/1990  McBride et al.
4,948,374 A *  8/1990  Carter .................... H01R 12/62
                                                          439/329

(Continued)

FOREIGN PATENT DOCUMENTS

JP        2011-159461        8/2011

*Primary Examiner* — Abdullah Riyami
*Assistant Examiner* — Nelson R Burgos-Guntin
(74) *Attorney, Agent, or Firm* — Wolf, Greenfield & Sacks, P.C.

(57) ABSTRACT

Electrical connectors provide signal connections between electronic devices using electrically-conductive contacts, or electrical contacts. In some applications, a connector including a solid substrate body may facilitate the connection of cables with a complementary connector.

21 Claims, 13 Drawing Sheets

(51) Int. Cl.
*H01R 12/71* (2011.01)
*H05K 1/11* (2006.01)

(56) References Cited

U.S. PATENT DOCUMENTS

| | | | | |
|---|---|---|---|---|
| 4,975,068 A * | 12/1990 | Squires | ................ | H01R 12/78 |
| | | | | 439/372 |
| 5,057,023 A * | 10/1991 | Kabadi | ................ | H01R 12/62 |
| | | | | 439/457 |
| 5,123,850 A * | 6/1992 | Elder | ................ | G01R 1/0483 |
| | | | | 324/750.05 |
| 5,385,490 A * | 1/1995 | Demeter | ............... | H01R 9/038 |
| | | | | 439/289 |
| 5,679,008 A * | 10/1997 | Takahashi | ............ | H01R 9/0515 |
| | | | | 439/497 |
| 6,042,389 A * | 3/2000 | Lemke | ............... | H01R 43/0256 |
| | | | | 439/74 |
| 6,139,357 A * | 10/2000 | Shih | ................ | H01R 12/62 |
| | | | | 439/493 |
| 6,235,995 B1 * | 5/2001 | Cheng | ................ | H05K 1/024 |
| | | | | 174/250 |
| 6,319,066 B2 * | 11/2001 | Kuo | ................ | 439/638 |
| 6,347,946 B1 * | 2/2002 | Trobough | ............ | G01R 1/0416 |
| | | | | 361/790 |
| 6,454,596 B1 * | 9/2002 | Montagano | ....... | H01R 13/5804 |
| | | | | 439/460 |
| 6,805,563 B2 * | 10/2004 | Ohashi | ............... | H05K 7/1061 |
| | | | | 439/331 |
| 6,867,668 B1 | 3/2005 | Dagostino et al. | | |
| 6,930,240 B1 * | 8/2005 | Giboney | .......... | H01R 13/65802 |
| | | | | 174/36 |
| 6,969,270 B2 * | 11/2005 | Renfro | ................ | H01R 13/193 |
| | | | | 439/342 |
| 7,148,428 B2 * | 12/2006 | Meier | ................ | G06F 1/184 |
| | | | | 174/260 |
| 7,248,481 B2 * | 7/2007 | Trobough | ............ | H05K 7/1061 |
| | | | | 361/785 |
| 7,257,004 B2 * | 8/2007 | Costello | ................ | H05K 1/141 |
| | | | | 174/16.3 |
| 7,284,992 B2 * | 10/2007 | Becker | ................ | H01L 23/3675 |
| | | | | 257/E23.065 |
| 7,692,281 B2 * | 4/2010 | McAlonis | .......... | H01R 13/2442 |
| | | | | 257/668 |
| 8,064,214 B2 * | 11/2011 | Frasco | ................... | H05K 1/184 |
| | | | | 174/260 |
| 8,183,466 B2 | 5/2012 | Morlion et al. | | |
| 8,317,524 B2 * | 11/2012 | Bailey | ................ | H01R 12/616 |
| | | | | 174/117 F |
| 8,353,708 B2 * | 1/2013 | Hsu | ...................... | H05K 7/1007 |
| | | | | 439/67 |
| 8,672,688 B2 * | 3/2014 | Florence, Jr. | .......... | H01R 12/52 |
| | | | | 439/66 |
| 9,209,537 B2 * | 12/2015 | Hsu | ...................... | H01R 12/79 |
| 2004/0161954 A1 | 8/2004 | Johnescu et al. | | |
| 2007/0105410 A1 | 5/2007 | Wu | | |
| 2007/0149000 A1 * | 6/2007 | Baskaran | ............... | H05K 1/147 |
| | | | | 439/67 |
| 2007/0264845 A1 * | 11/2007 | Simonsson | ............ | H01R 12/62 |
| | | | | 439/67 |
| 2008/0072422 A1 * | 3/2008 | Levante | ................ | H01R 12/57 |
| | | | | 29/852 |
| 2009/0023330 A1 | 1/2009 | Stoner et al. | | |
| 2011/0045702 A1 | 2/2011 | Su et al. | | |
| 2011/0300749 A1 | 12/2011 | Sytsma et al. | | |
| 2012/0077371 A1 * | 3/2012 | Fix | ........................... | H02G 3/32 |
| | | | | 439/497 |
| 2013/0188325 A1 * | 7/2013 | Garman | ............... | H05K 9/0007 |
| | | | | 361/753 |
| 2013/0273781 A1 | 10/2013 | Buck | | |
| 2014/0017957 A1 | 1/2014 | Horchler et al. | | |
| 2016/0056554 A1 * | 2/2016 | Costello | ............ | H01R 12/7076 |
| | | | | 439/65 |
| 2016/0099518 A1 * | 4/2016 | Jordan | ................... | H01R 13/74 |
| | | | | 439/374 |

\* cited by examiner

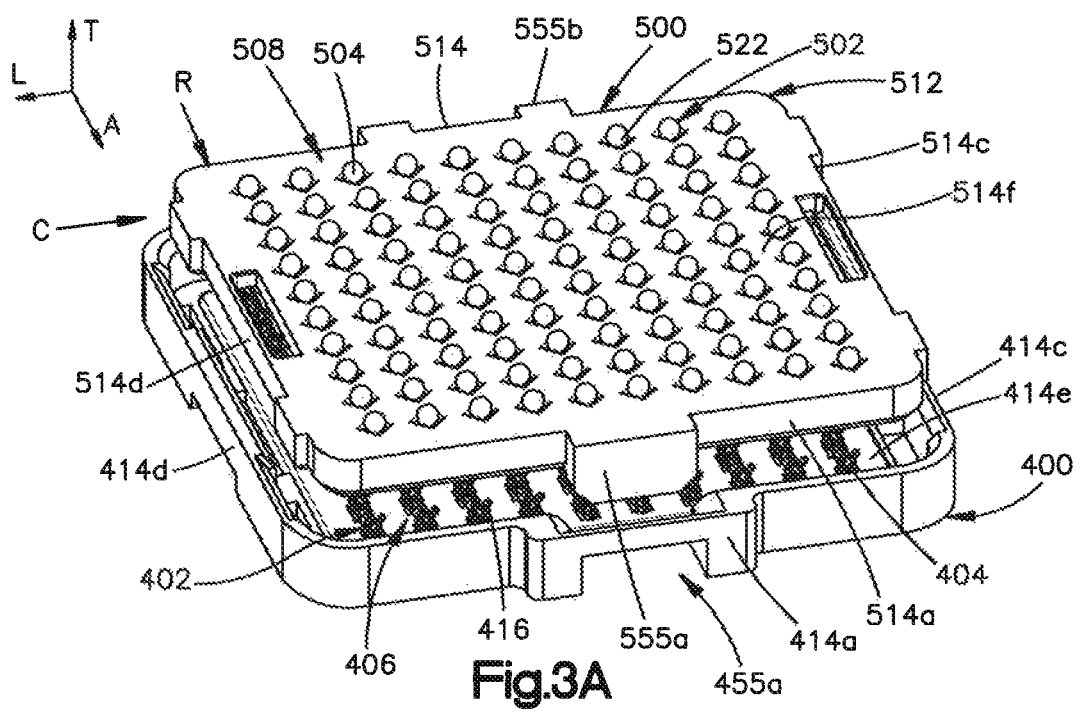
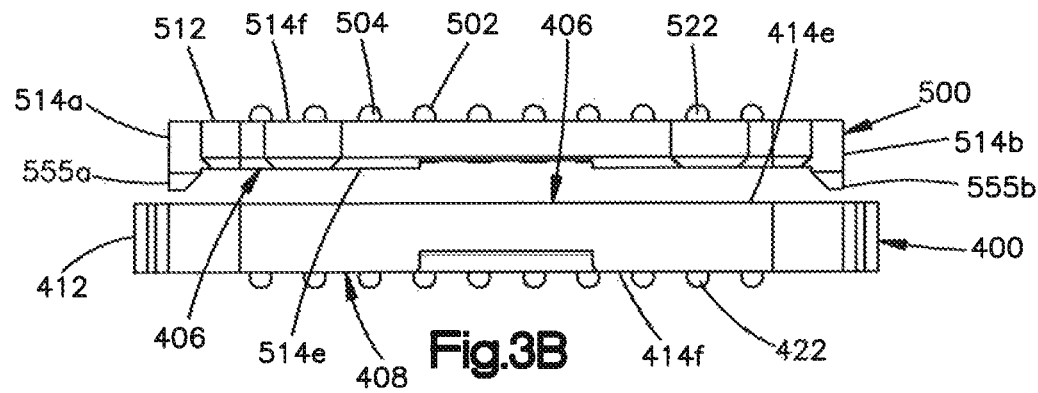
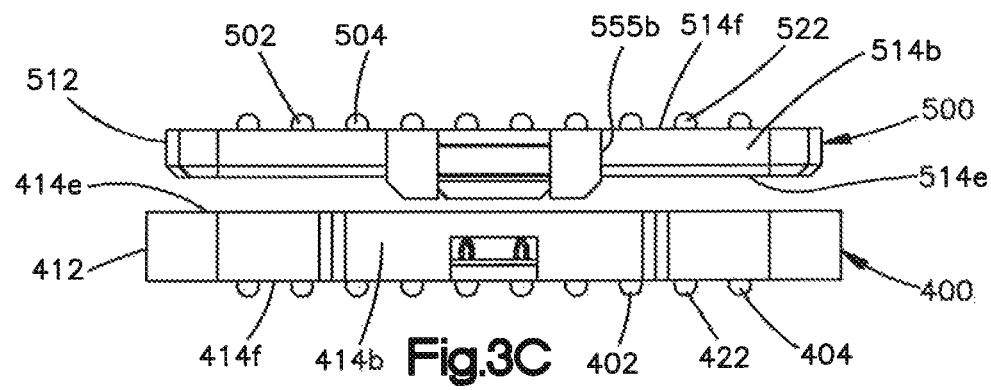

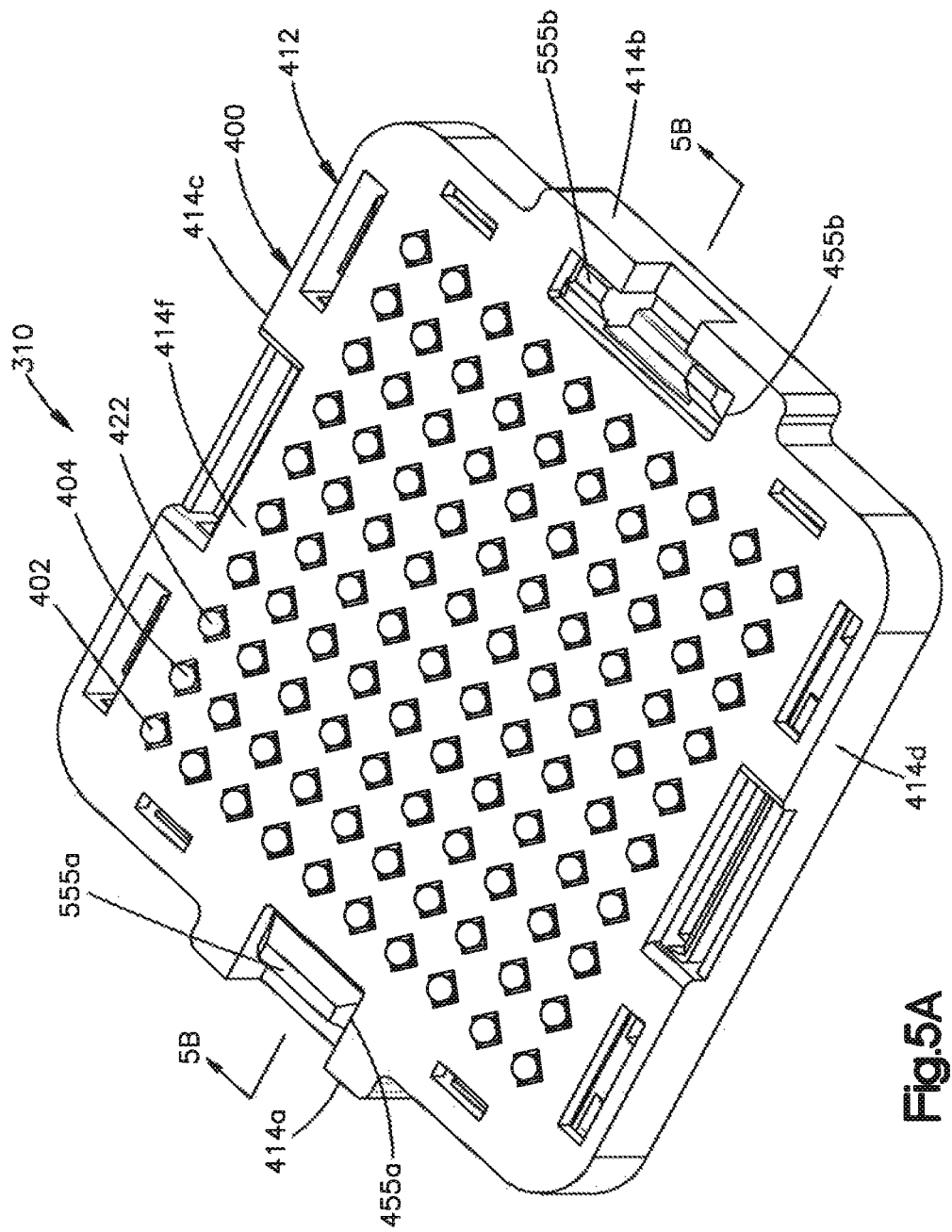

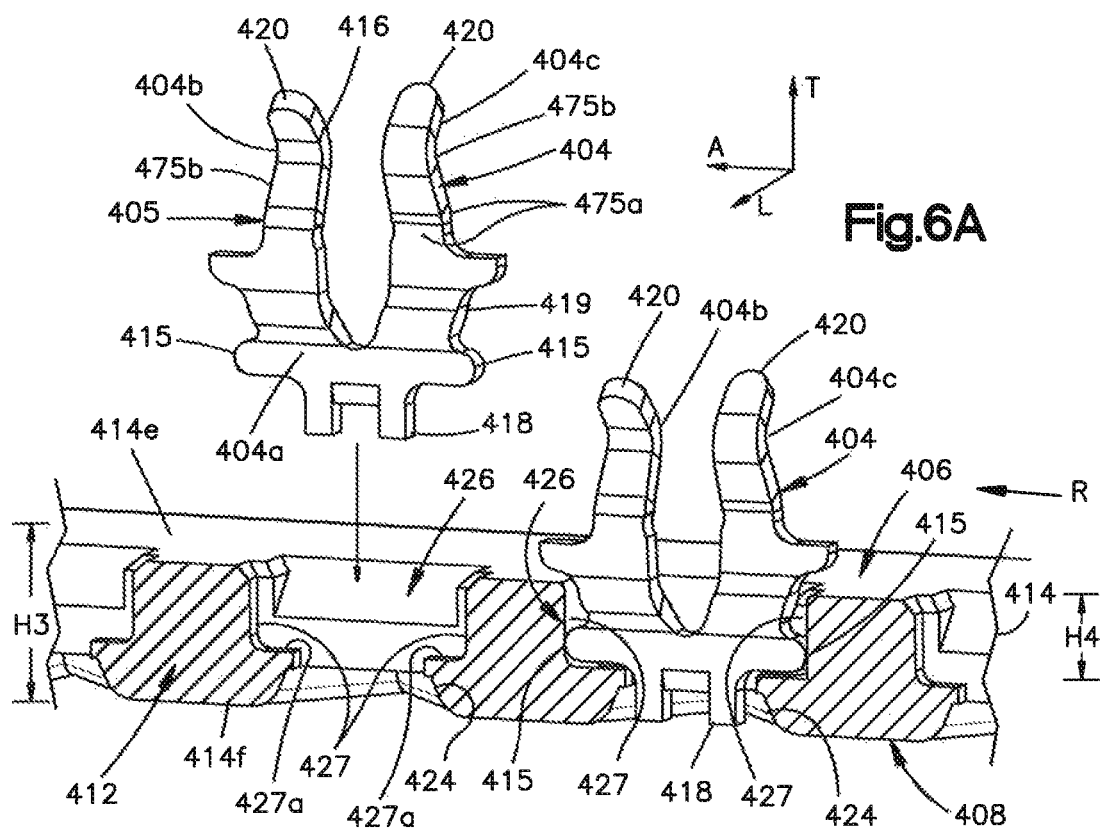
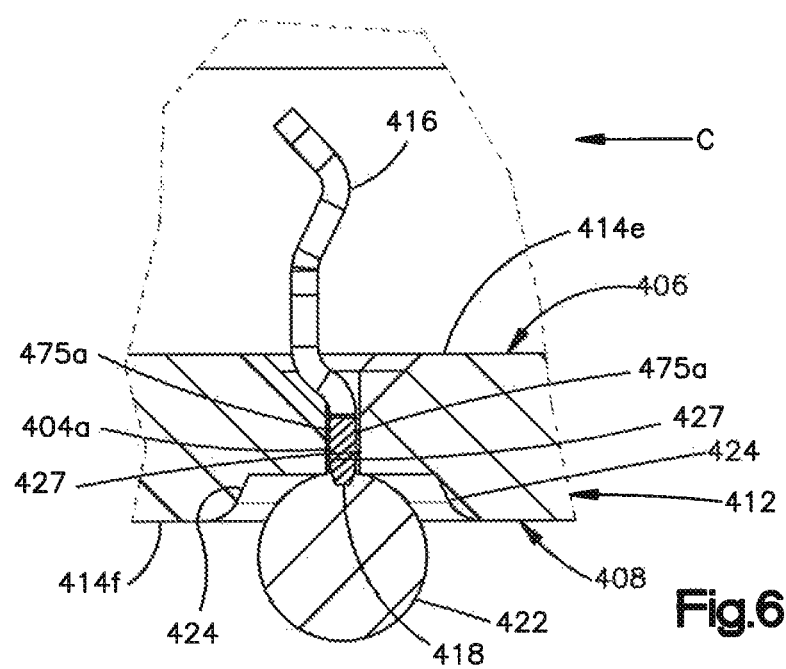

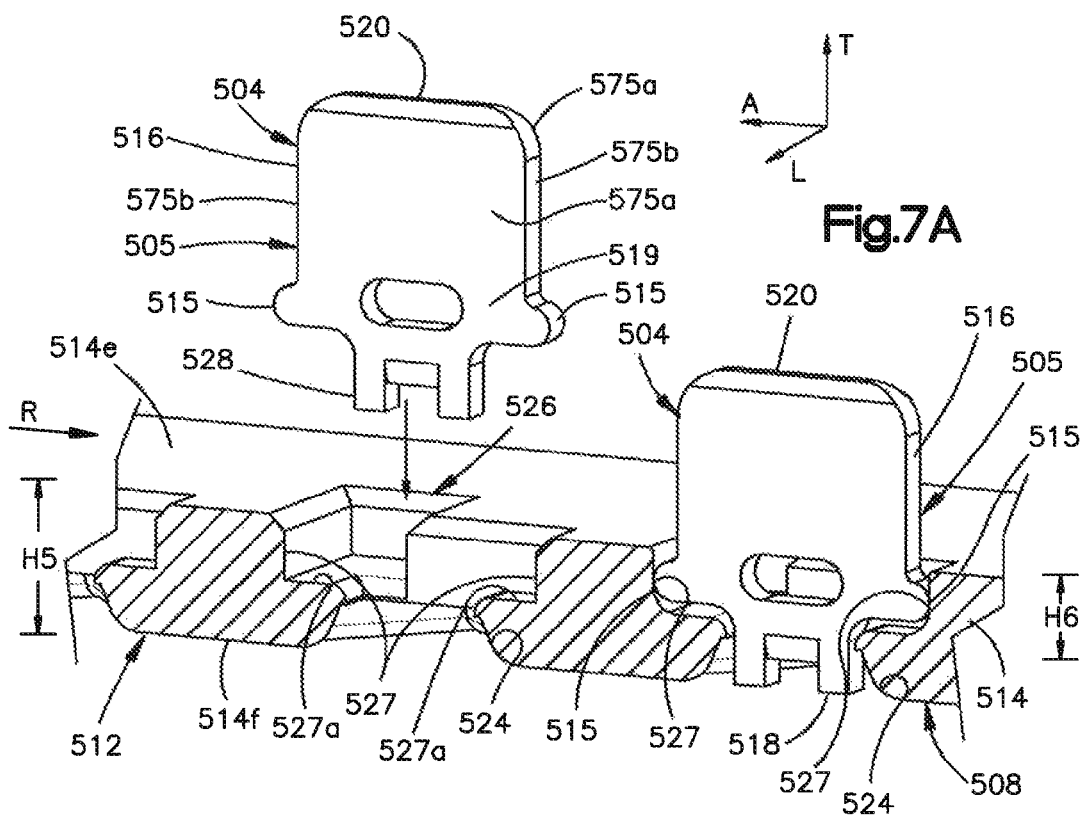
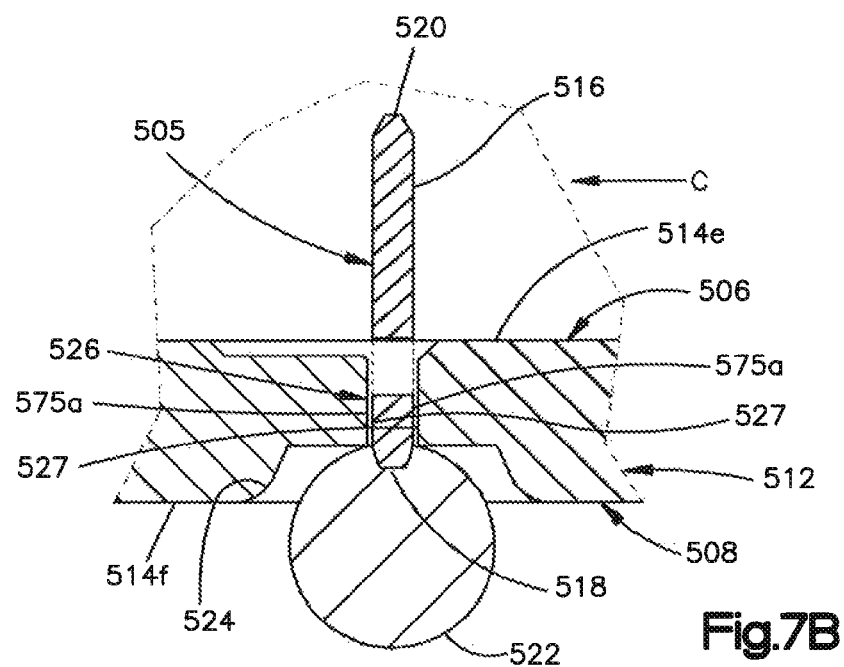

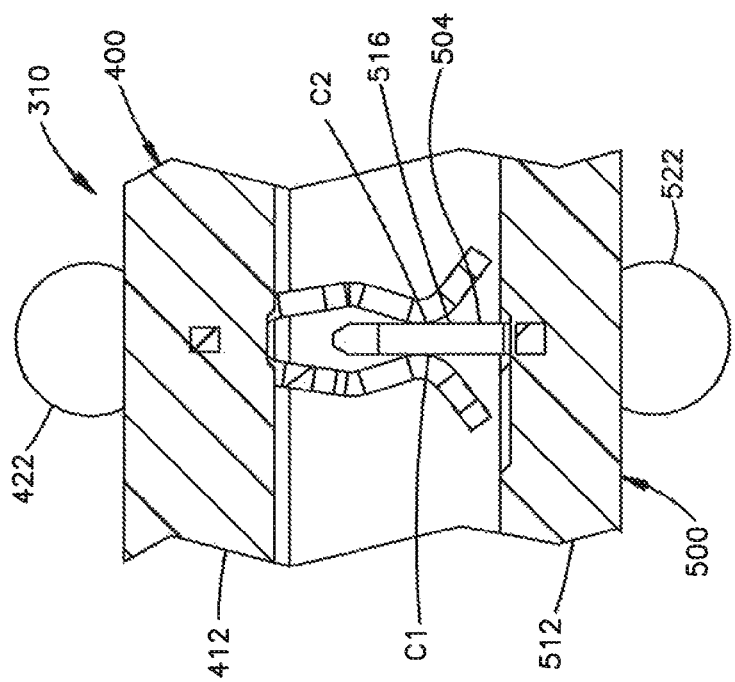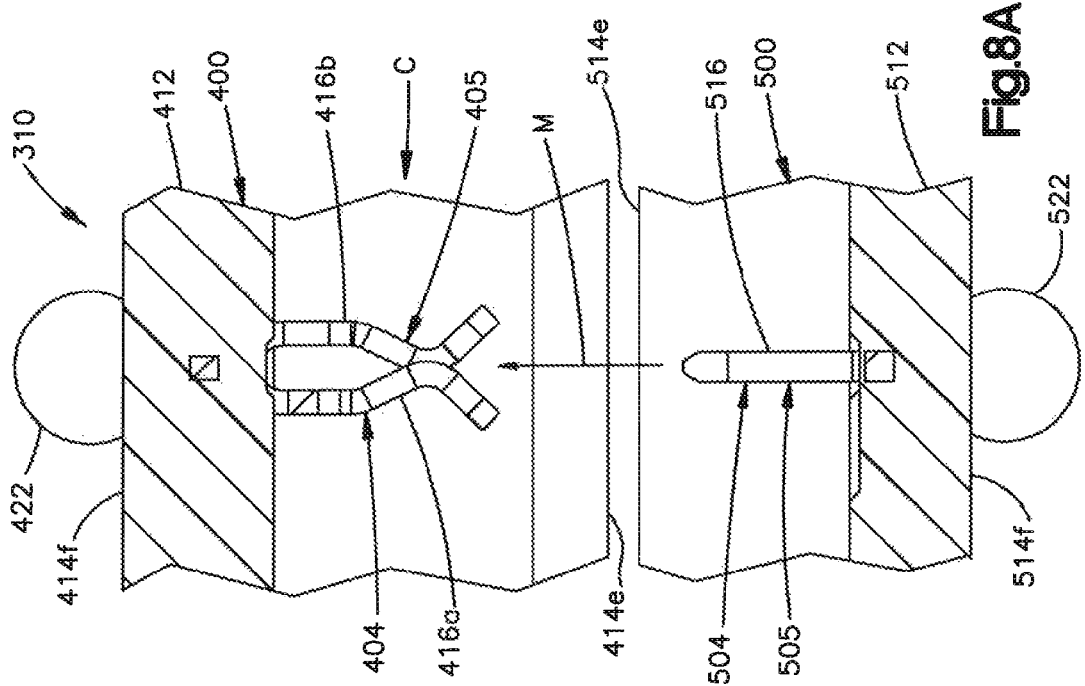

ELECTRICAL CONNECTOR SYSTEM INCLUDING ELECTRICAL CABLE CONNECTOR ASSEMBLY

CROSS-REFERENCE TO RELATED APPLICATIONS

This application is the National Stage of International Application No. PCT/US2014/031642, filed Mar. 25, 2014, which claims the benefit of U.S. application No. 61/805,117, filed Mar. 25, 2013, the disclosures of which are incorporated herein by reference in their entireties.

BACKGROUND

Electrical connectors provide signal connections between electronic devices using electrically-conductive contacts, or electrical contacts. In some applications, a connector including a solid substrate body may facilitate the connection of cables with a complementary connector.

SUMMARY

In accordance with one aspect of the present disclosure, an electrical cable connector assembly can include a printed circuit board that, in turn, includes including a body, a first plurality of electrically conductive contact pads supported by the body so as to define an array of electrically conductive contact pads, and a second plurality of electrically conductive contact pads supported by the body at a location spaced from the array of electrically conductive contact pads. Respective ones of the second plurality of electrically conductive contact pads are in electrical communication with respective ones of the first plurality of electrically conductive contact pads. The electrical cable connector assembly can further include an electrical connector mounted to the printed circuit board. The electrical connector can include a plurality of electrical contacts that are individually, physically and electrically connected to respective ones of the first plurality of electrically conductive contact pads. The electrical cable connector assembly can further include at least one electrical cable including at least one electrical signal conductor individually, physically and electrically attached to at least a respective one of the second electrically conductive contact pads.

The general description and the following detailed description are example and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the disclosure, there are shown in the drawings example embodiments of the disclosure; however, the invention is not limited to the specific methods, compositions, and devices disclosed. In addition, the drawings are not necessarily drawn to scale. In the drawings:

FIG. 3A is a perspective view of a receptacle connector and a header connector of the electrical connector system illustrated in FIG. 1, configured to be mated with each other;

FIG. 3B is a side elevation view of the receptacle connector and the header connector illustrated in FIG. 3A;

FIG. 3C is another side elevation view of the receptacle connector and the header connector illustrated in FIG. 3A;

FIG. 5A is a top plan view of the receptacle connector and the header connector illustrated in FIG. 3A, shown mated with each other;

FIG. 6A is a partial exploded perspective view of one of the electrical contacts of the receptacle connector shown being inserted into the connector housing, and shown inserted in the connector housing;

FIG. 6B is a sectional side elevation view of the electrical contact illustrated in FIG. 6A, shown inserted in the connector housing;

FIG. 7A is a partial exploded perspective view of one of the electrical contacts of the header connector shown being inserted into the connector housing, and shown inserted in the connector housing;

FIG. 7B is a sectional side elevation view of the electrical contact illustrated in FIG. 7A, shown inserted in the connector housing;

FIG. 8A is a side elevation view of the electrical contacts of the header connector aligned to be mated with the electrical contacts of the receptacle connector;

FIG. 8B is a side elevation view of the electrical contacts illustrated in FIG. 8A shown mated;

DETAILED DESCRIPTION

The present disclosure may be understood more readily by reference to the following detailed description taken in connection with the accompanying figures and examples, which form a part of this disclosure. It is to be understood that this disclosure is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the disclosure which are, for clarity, described herein in the context of separate embodiments, may also be provided in combination in a single embodiment. Conversely, various features of the disclosure that are, for brevity, described in the context of a single embodiment, may also be provided separately or in any suitable sub combination as desired.

Figure 1:
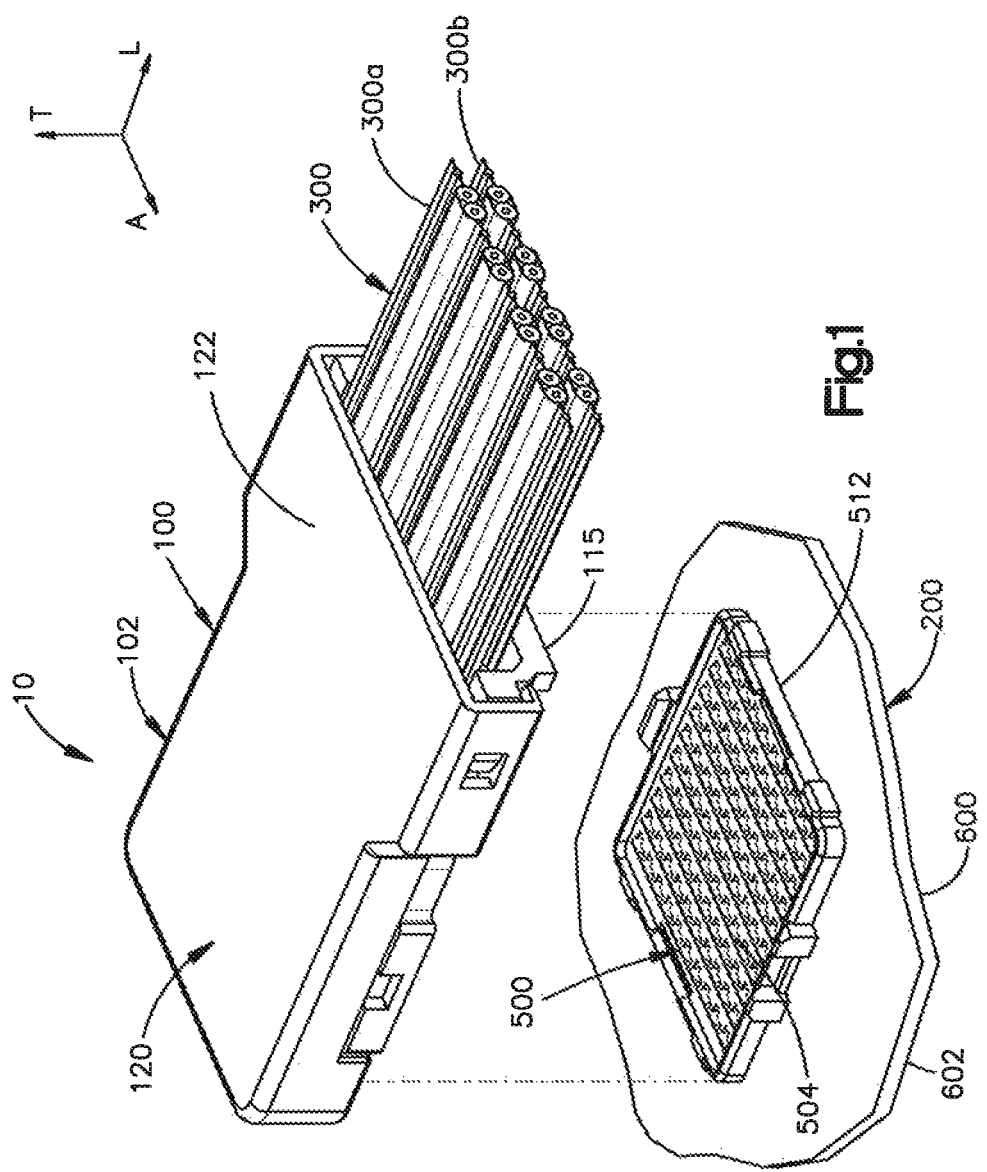
FIG. 1 is an exploded perspective view of an electrical connector system constructed in accordance with one embodiment.
Figure 2A:
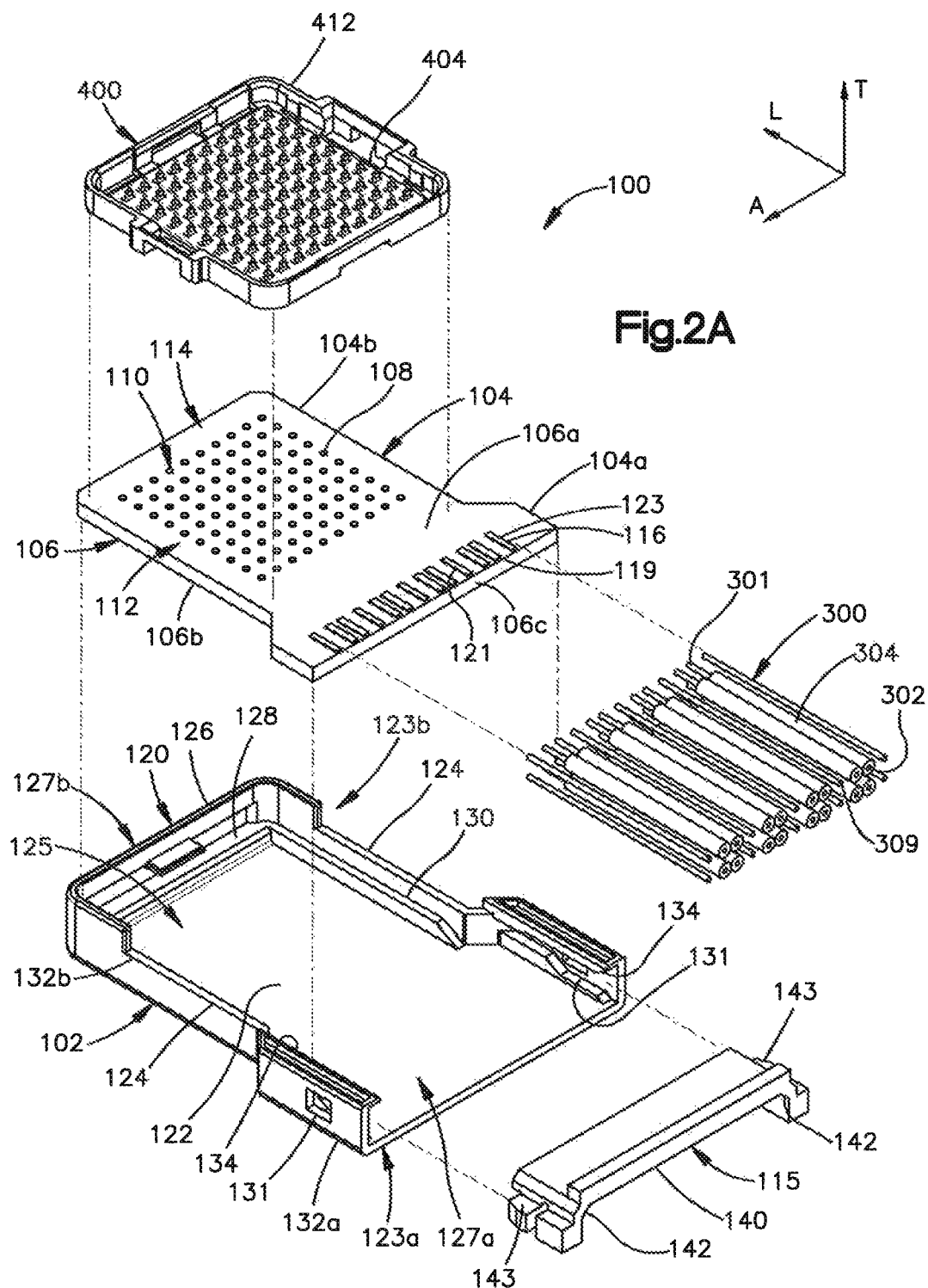
FIG. 2A is an exploded perspective view of a cable connector assembly of the electrical connector system illustrated in FIG. 1.
Figure 2B:
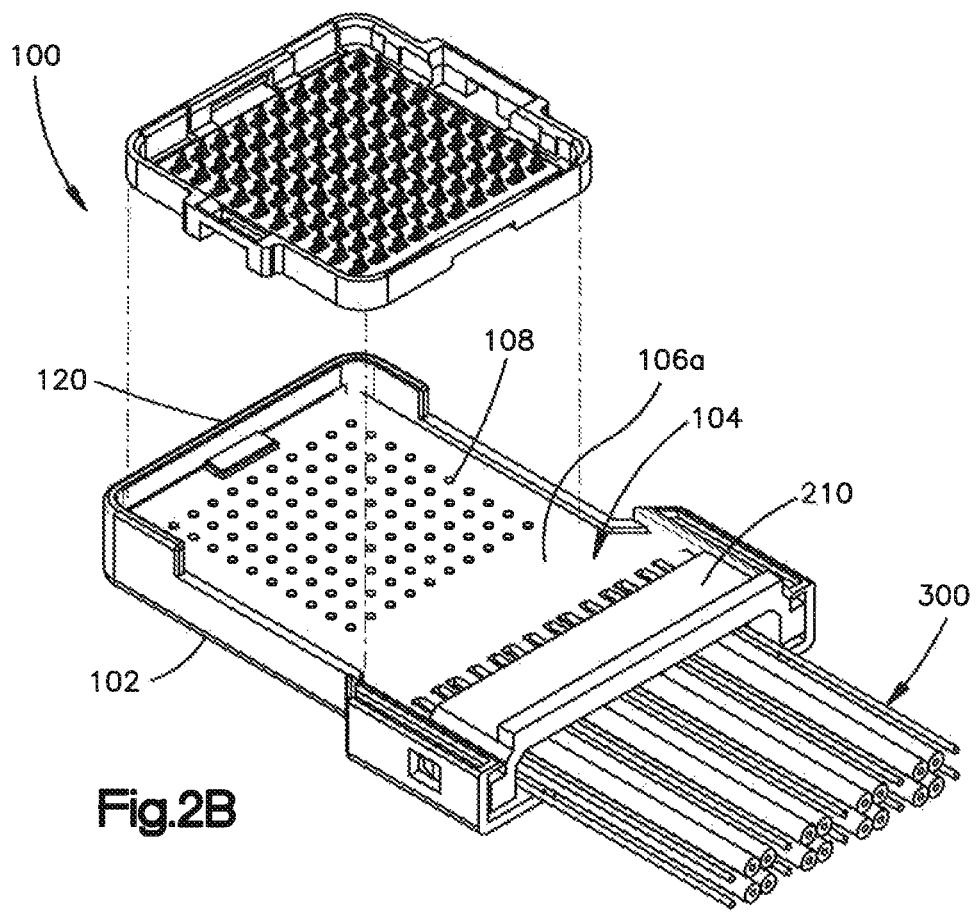
FIG. 2B is another exploded perspective view of the cable connector assembly illustrated in FIG. 2A.
Figure 2C:
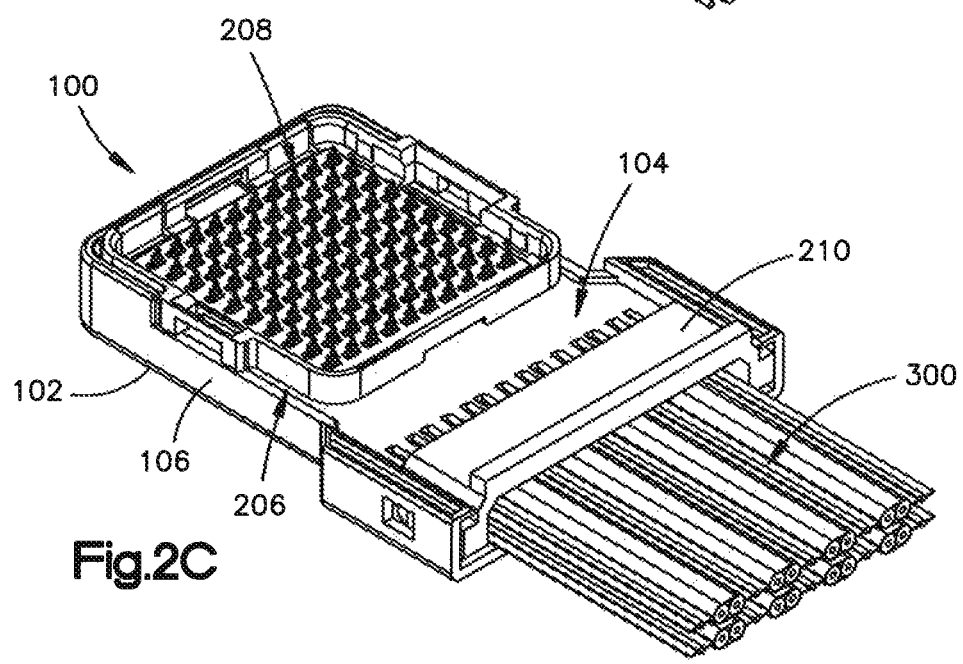
FIG. 2C is a perspective view of the cable connector assembly illustrated in FIG. 2B.
Figure 2D:
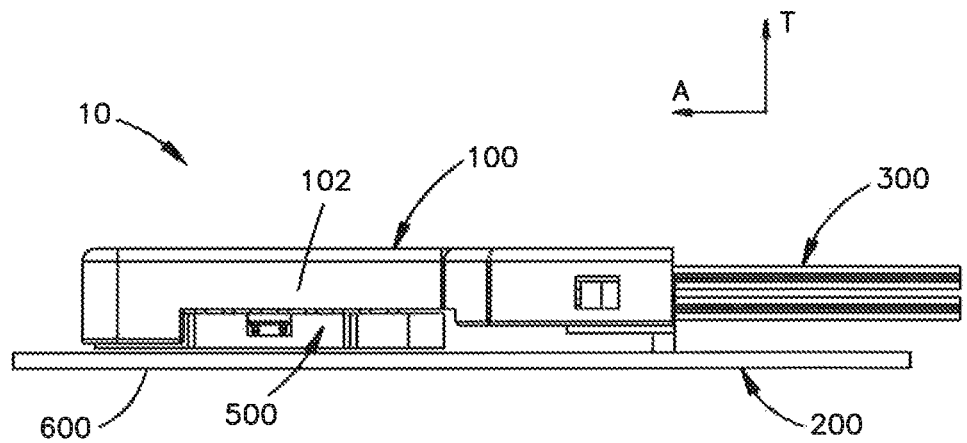
FIG. 2D is a side elevation view of the electrical cable connector system illustrated in FIG. 1A showing the system in an assembled configuration.
Figure 2E:
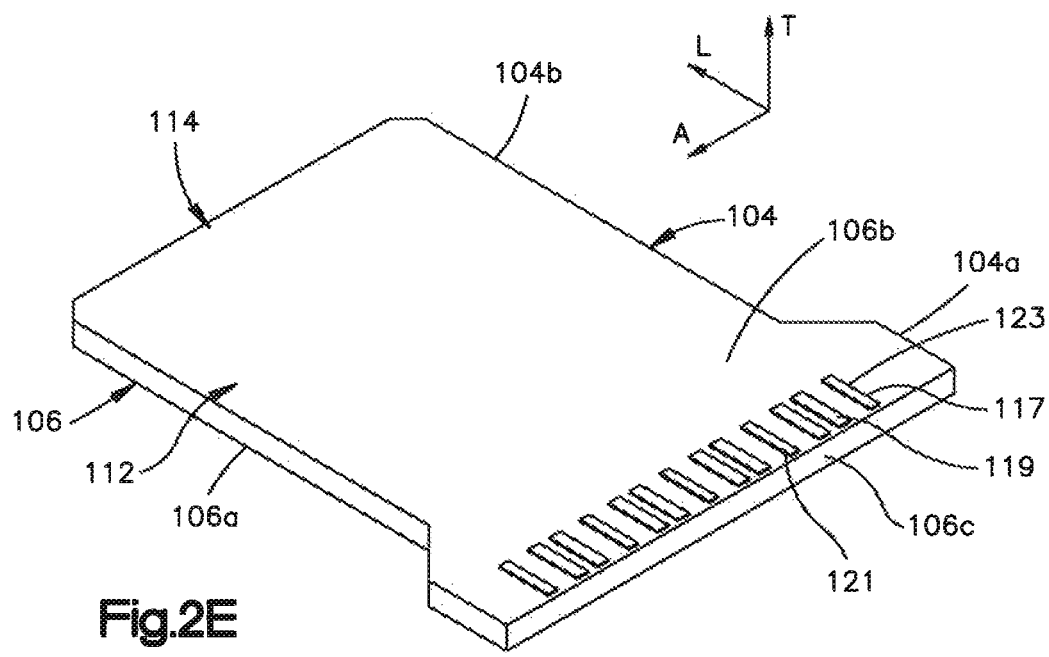
FIG. 2E is a perspective view of a printed circuit board of cable connector assembly illustrated in FIG. 2A.
Figure 4A:
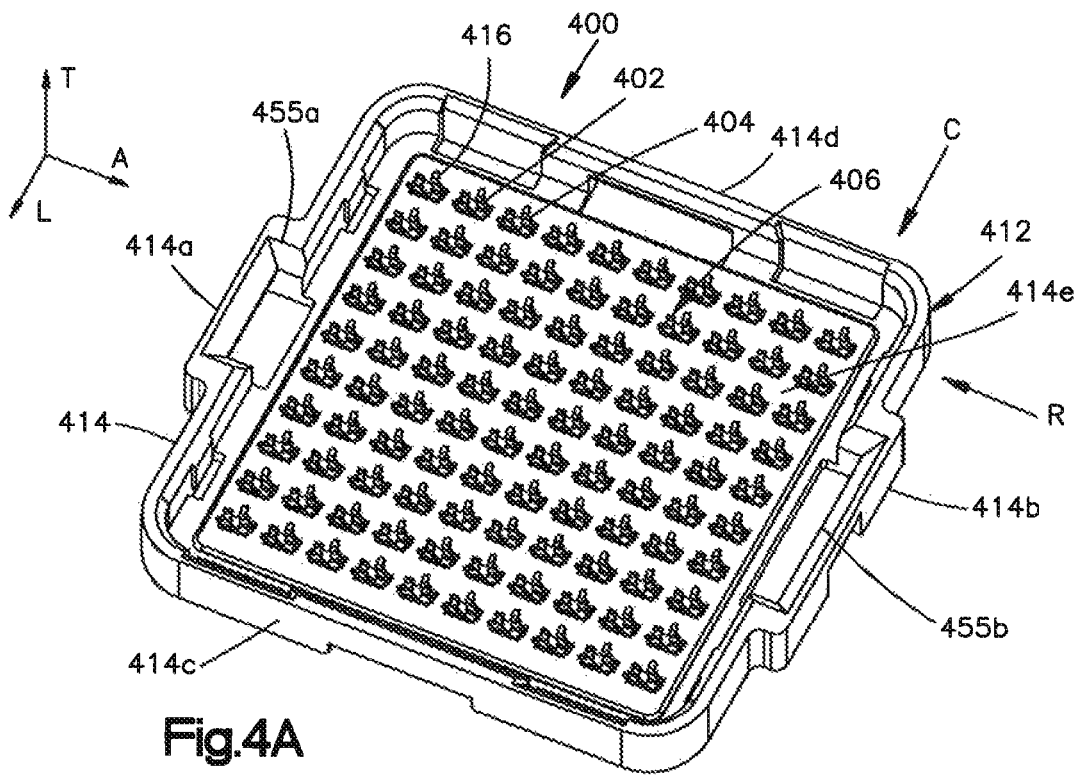
FIG. 4A is a perspective view of the receptacle connector illustrated in FIG. 3A, showing the mating interface.
Figure 4B:
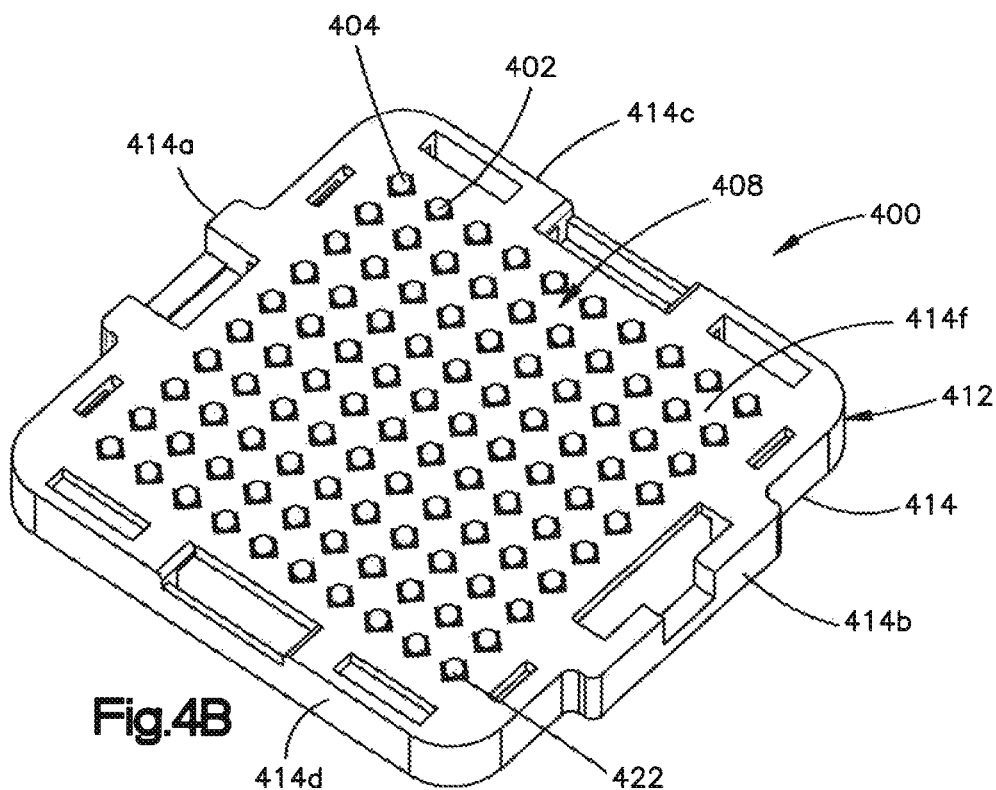
FIG. 4B is a perspective view of the receptacle connector illustrated in FIG. 3A, showing the mounting interface.
Figure 4C:
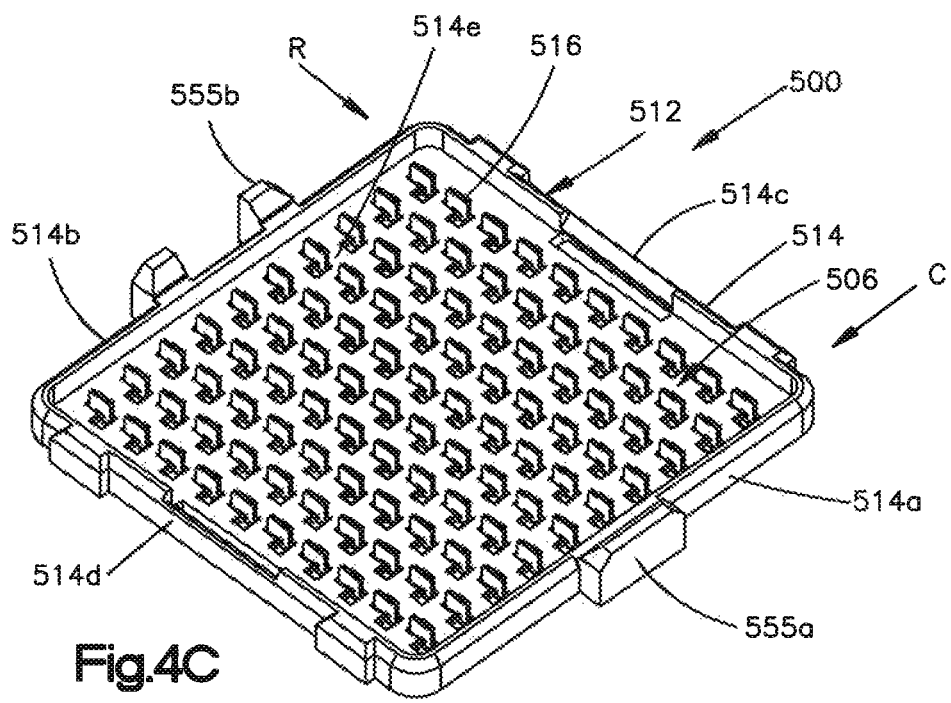
FIG. 4C is a perspective vie of the header connector illustrated in FIG. 3A, showing the mating interface.
Figure 4D:
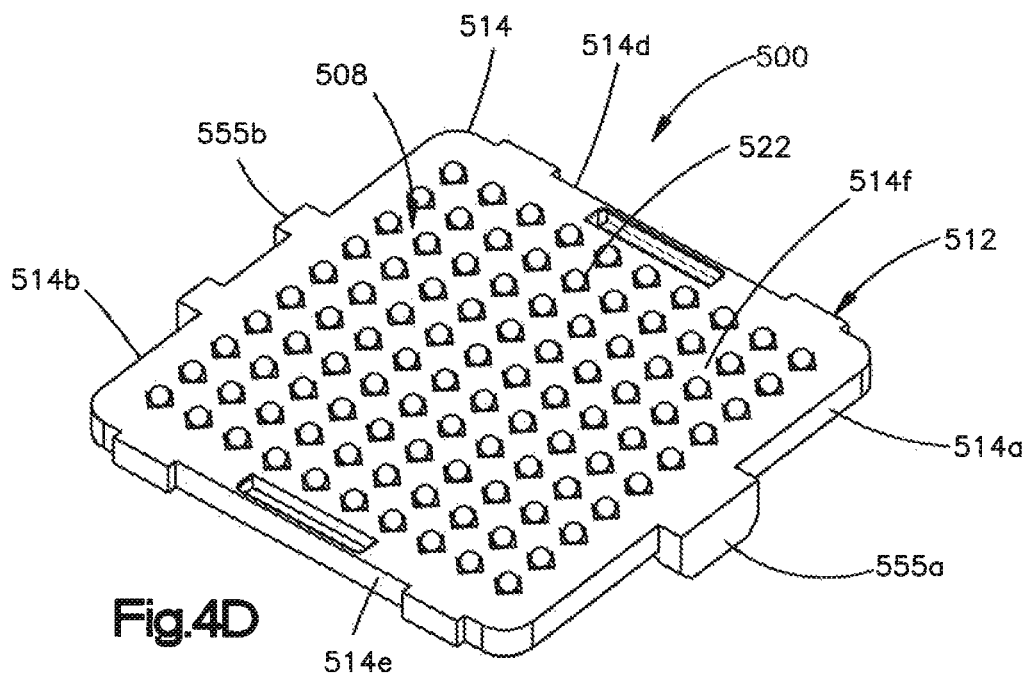
FIG. 4D is a perspective view of the header connector illustrated in FIG. 3A, showing the mounting interface.
Figure 5B:
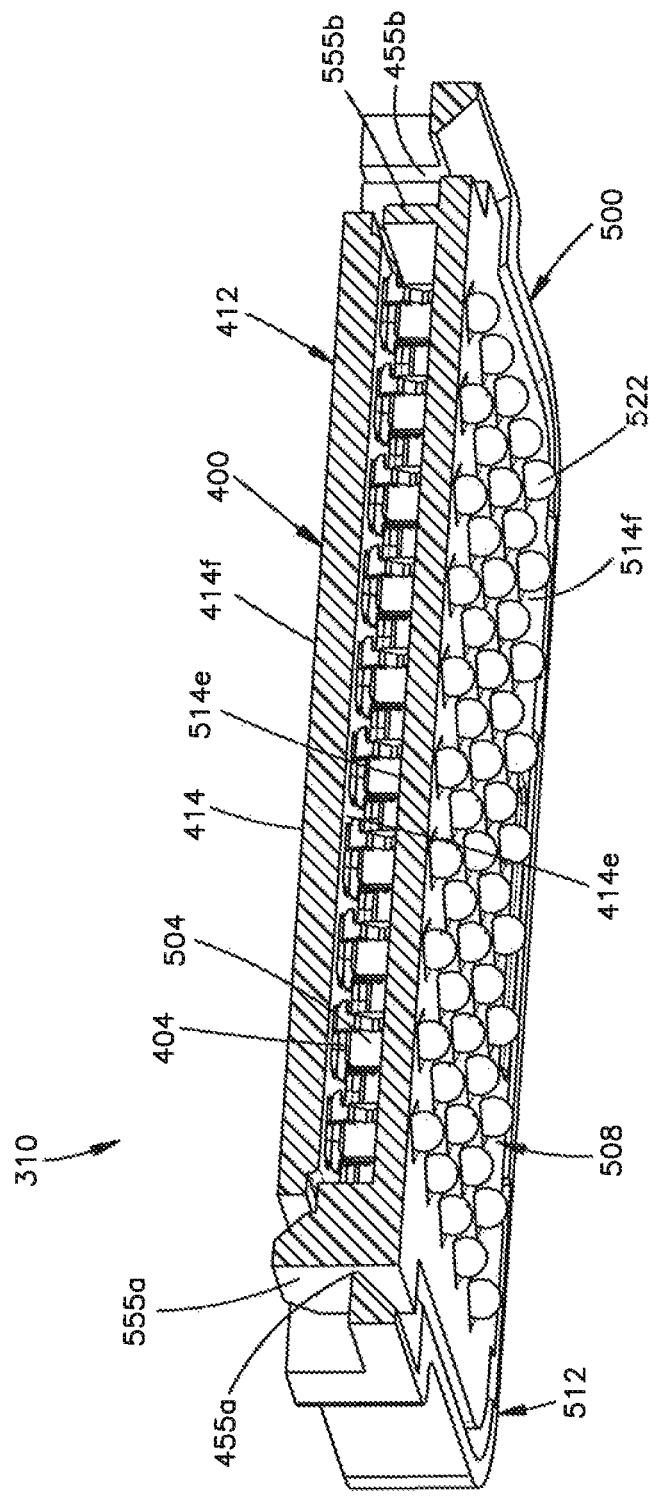
FIG. 5B is a sectional side elevation view of the receptacle connector and the header connector illustrated in FIG. 5A, taken along line 5B-5B.

Referring to FIGS. 1-2D, an electrical connector system 10 includes an electrical cable connector assembly 100, and a complementary second electrical connector assembly 200 configured to mate with the electrical cable connector assembly 100. The electrical cable connector assembly 100 can include a housing, which can be referred to as a system housing 102, electrical cables 300 supported by the system housing 102, and an electrical connector 400 supported by the system housing 102. Electrical connector 400 may, itself, have a housing 206 and an arary 208 of mating contacts configured to mate with contacts of another connector. The electrical cables 300 are supported by the system housing 102 so as to be placed in electrical communication with the electrical connector 400. For instance, the electrical cable connector assembly 100 can include a substrate, which can be configured as a first printed circuit board 104. The electrical connector 400 and the electrical cables 300 are each configured to be mounted to the printed circuit board 104, as described in more detail below, so as to place the electrical cables 300 in electrical communication with the electrical connector 400. The second electrical connector assembly 200 can include a second electrical connector 500 and an electrical component 600. The electrical component 600 can be configured as desired, and in one embodiment can be configured as a substrate that, in turn, defines a second printed circuit board 602. The second electrical connector 500 is configured to be mounted to the electrical component 600 so as to place the second electrical connector 500 in electrical communication with the electrical component 600.

The system housing 102 can include a housing body 120 and a retention member 115 that is configured to be attached to the housing body 120. The housing body 120 is configured to support the first printed circuit board 104. When the electrical connector 400 is mounted to the first printed circuit board 104, the housing body 120 can be said to support the electrical connector 400 as well. The retention member 115 is configured to apply a compressive force to the electrical cables 300 against the housing body 120. The housing body 120 includes a housing base 122. The housing base 122 can be sized and shaped as desired. For instance, the housing base 122 can be substantially planar along the longitudinal direction L and the lateral direction A. The housing body 120 can further define opposed side walls 124 that extend out from the housing base 122 along the transverse direction T. The side walls 124 can be spaced from each other along the lateral direction A. The housing body 120 can further include a rear wall 126 that extends out from the housing base 122 along the transverse direction T. The rear wall 126 can extend between the side walls 124 along the lateral direction A. For instance, the rear wall 126 can extend from one of the side walls 124 to the other of the side walls 124. The housing base 122, the side walls 124, and the rear wall 126 can define a void 125.

It should be appreciated that the housing base 122 defines a first transverse end 123a of the housing body 120 along the transverse direction T. The housing body 120 can define a second transverse end 123b along the transverse direction T opposite the first transverse end 123a. Thus, the second transverse end 123b can be opposite the housing base 122 along the transverse direction T. At least a portion up to an entirety of the second transverse end 123b can be open to the void 125 along the transverse direction. It should be further appreciated that the housing body 120 defines an open first longitudinal end 127a, and the rear wall defines a second longitudinal end 127b of the housing body 120 opposite the first longitudinal end 127a along the longitudinal direction L. Thus, the first longitudinal end 127a can be opposite the rear wall 126 along the longitudinal direction L. At least a portion up to an entirety of the first longitudinal end 127a can be open to the void 125 along the longitudinal direction L. A direction from the first longitudinal end 127a toward the second longitudinal end 127b along the longitudinal direction L can be referred to as a forward direction. A direction from the second longitudinal end 127b toward the first longitudinal end 127a along the longitudinal direction L can be referred to as a rearward direction.

The system housing 102 can further include a brace 128 that is supported by the housing body 120. For instance, the brace 128 can be directly supported by at least one or both of the side walls 124. Alternatively or additionally, the brace 128 can be directly supported by the rear wall 128. For instance, the brace 128 can be configured as a ledge 130 that extends from at least one or both of the side walls 124 into the void 125 toward the other of the side walls 124. Alternatively or additionally, the ledge 130 can extend the rear wall 128 into the void 125. The ledge 130 is configured to provide a seat for the first printed circuit board 104.

The housing body 120 can define a first region 132a and a second region 132b that is spaced from the first region 132a in the forward direction. The ledge 130 can extend from the side walls 124 at the second region 132b, and can terminate without extending from the side walls 124 at the first region 132a. The first printed circuit board 104 is configured to be inserted into the housing body 120 through the open first longitudinal end 127a along the forward direction so that the first printed circuit board 104 is supported by the ledge 130. For instance, the ledge 130 can be disposed between the first printed circuit board 104 and the housing base 122. It should be appreciated that the printed circuit board 104 defines a first region 104a and a second region 104b spaced from the first region 104a in the forward direction. The first printed circuit board 104 defines a first width along the lateral direction A at the first region 104a and a second width along the lateral direction A at the second region 104b that is less than the first width. When the printed circuit board 104 is supported by the housing body 120, the second region 104b is disposed at the second region 132b of the housing body 120. The first region 104a is disposed at the first region 132a of the housing body 120. Thus, the electrical cable assembly 100 can be constructed such that the first region 104a of the first printed circuit board 104 is not directly supported by the ledge 130.

The side walls 124 can be spaced from each other a first width at the first region 132a along the lateral direction A. The side walls 124 can be spaced from each other a second width at the second region 132b along the lateral direction A. The first width is greater than the second width. The first region 312a of the housing body 120 can further include a rail 134 that extends from each of the side walls 124 toward the other of the side walls 124 along the lateral direction A. The rails 134 can thus be spaced from the housing base 122 along the transverse direction T. The first region 312a of the housing body 120 can further include an attachment member that is configured to attach to the retention member 115. For instance, the attachment member can be configured as an aperture 131 that extends through each of the side wails 124. For instance, the apertures 131 can be disposed between the rails 134 and the base 122.

Referring now to FIGS. 1A-2E, the first printed circuit board 104 can define a dielectric or electrically insulative substrate body 106 and a first plurality of mounting locations. The first plurality of mounting locations can be configured as a first plurality of electrically conductive contact pads 108 carried by the body 106. The substrate body 106 can be made of any suitable material, such as a thermoset resin. The substrate body 106 can be substantially rigid, and planar along the lateral direction A and the longitudinal direction L. For instance, when a bending force is applied to the substrate body 106 sufficient to cause the substrate body to bend, and the bending force is released, the substrate body 106 returns to a substantially planar configuration. The contact pads 108 can be arranged in an array 110 as described herein with respect to the electrical contacts 404, such that each of the electrical contacts 404 is configured to be mounted to respective ones of the contact pads 108. For instance, the array 110 can include a plurality of rows 112 and a plurality of columns 114 that are oriented perpendicular with respect to the rows 112. The rows 112 and columns 114 can be oriented in any directions as desired. In one example, the rows 112 can be oriented in the lateral direction A, and the columns 114 are oriented in the longitudinal direction L. The first electrical connector 400 is configured to be mounted to the first printed circuit board 104 such that the electrical contacts 404 are placed in physical and electrical contact with respective ones of the contact pads 108. The contact pads can be configured to electrically connect with mounting ends of the electrical contacts of the first electrical connector 400 in any manner as desired, including a variety of surface mounted connectors such as fusible elements (which may be referred to as a ball grid array (BGA)), land grid array (LGA), J-leads, and/or socket Ts.

The body 106 of the first printed circuit board 104 can define a first surface 106a and a second surface 106b opposite the first surface 106a along the transverse direction T. Each of the first and second surfaces can be planar along the lateral direction A and the longitudinal direction L. The first surface 106a can carry the first plurality of contact pads 108. The second surface 106b can face the system housing 102. In particular, the second surface 106b can face the housing base 122 of the system hosing 102. The first printed circuit board 104 further includes at least a second plurality of mounting locations that are in electrical communication with respective ones of the first plurality of mounting locations. The second plurality of mounting locations are configured to physically and electrically contact respective ones of the electrical cables 300. The second plurality of mounting locations can be configured as a second plurality of electrical contact pads 116 that are configured to physically and electrically contact respective ones of the electrical cables 300. The second plurality of contact pads 116 can be disposed proximate to an edge 106c of the body 106 that is oriented along the lateral direction A. The edge 106c can be disposed at the first region 104a. Thus, the contact pads 116 can be disposed at the first region 104a. The contact pads of the second plurality of contact pads 116 can be spaced from each other along the lateral direction A. For instance, the second plurality of contact pads 116 can be supported by the first surface 106a of the first printed circuit board 104. At least some of the second plurality of contact pads 116 up to all of the second plurality of contact pads 116 are in electrical communication with a respective at least one of the first plurality of contact pads 108. For instance, the printed circuit board 104 can include a plurality of electrical traces that are supported by the body 106 and electrically connect respective ones of the first plurality of contact pads 108 with respective ones of the second plurality of contact pads 116.

The first printed circuit board 104 further includes a third plurality of mounting locations that are in electrical communication with respective ones of the first plurality of mounting locations. The third plurality of mounting locations are configured to physically and electrically contact respective ones of the electrical cables 300. The third plurality of mounting locations can be configured as a third plurality of contact pads 117 that are configured to physically and electrically contact respective ones of the electrical cables 300. The third plurality of contact pads 117 can be disposed proximate to the edge 106c of the body 106. Thus, the contact pads 117 can be disposed at the first region 104a. The contact pads 117 of the third plurality of contact pads 117 can be spaced from each other along the lateral direction A. For instance, the third plurality of contact pads 117 can be supported by the second surface 106b of the first printed circuit board 104. In one embodiment, the second surface 106b can be devoid of any mounting locations other than the third plurality of contact pads 117. In accordance with one embodiment, the third plurality of contact pads 117 can be opposite the second plurality of contact pads 117. At least some of the third plurality of contact pads 117 up to all of the third plurality of contact pads 117 are in electrical communication with a respective at least one of the first plurality of contact pads 108. For instance, the printed circuit board 104 can include a plurality of electrical traces that are supported by the body 106 and electrically connect respective ones of the first plurality of contact pads 108 with respective ones of the third plurality of contact pads 117.

Referring now to FIGS. 1A-2C, and as described above, the system housing 102 includes a retention member 115 that is configured to be attached to the housing body 120. The housing 102 is configured to capture the electrical cables 300 between the housing body 120 and the retention member 115 when the electrical cables are mounted to the printed circuit board 104 when the printed circuit board 104 is supported by the system housing 102. The retention member 115 defines a retention base 140 and a pair of retention arms 142 that extend out from the retention base 140, The retention member 115 can further include an attachment member that is configured to attach the retention member 115 to the retention member of the housing body 120. For instance, the attachment member can be configured as a projection 143 that extends out from each of the retention arms 142, and is configured to be inserted into a respective one of the apertures 131 of the housing body 120.

It should be appreciated, of course, that the attachment member of the housing body 120 can be configured as a projection, and the attachment member of the retention member 115 can be configured as an aperture that receives the projection to attach the retention member 115 to the housing body 120. The retention arms 142 are configured to be received in a gap between the rail 134 and the housing base 122 along the forward direction until the projection is inserted into the aperture so as to attach the retention member 115 to the housing body 120. Retention member 115 may include a surface 210.

The connector housing 412 can include a housing body 414 that defines opposed first and second sides 414a and 414b that are spaced from each other along a first or longitudinal direction L, opposed third and fourth sides 414c and 414d that are spaced from each other along a second or lateral direction A that extends substantially perpendicular to the longitudinal direction L, an inner end 414e that defines a mating interface 406, and an outer end 414f that is spaced from the inner end 414e along a third or transverse direction T and defines an opposed mounting interface 408. The transverse direction T extends substantially perpendicular to both the longitudinal direction L and the lateral direction A. It should be appreciated that in accordance with the illustrated embodiment, the longitudinal direction L and the lateral direction A are oriented horizontally, and the transverse direction T is oriented vertically, though it should be appreciated that the orientation of the first electrical connector 400, and thus the electrical connector system 10, can vary during use. Unless otherwise specified herein, the terms "lateral," "laterally," "longitudinal," "longitudinally," "transverse," and "transversely" are used to designate perpendicular directional components in the drawings to which reference is made.

Similarly, the second electrical connector 500 can include a connector housing 512, which can be referred to as a second connector housing, that is configured to support the second array 502 of electrical contacts 504, which can be referred to as a second array of electrical contacts. The connector housing 512 can be made of any suitable dielectric material, such as plastic and the electrical contacts 504 can be made of any suitable electrically conductive material, such as metal. In accordance with the illustrated embodiment the connector housing 512 can be overmolded onto the electrical contacts 504. Alternatively, the electrical contacts 504 can be stitched into the connector housing 512 or otherwise supported by the connector housing 512 as desired. The connector housing 512 can include a housing body 514 that defines opposed first and second sides 514a and 514b that are spaced from each other along a first or longitudinal direction L, opposed third and fourth sides 514c and 514d that are spaced from each other along a second or lateral direction A that extends substantially perpendicular to the longitudinal direction L, an inner end 514e, and an outer end 514f that is spaced from the inner end 514e along a third or transverse direction T that extends substantially perpendicular to both the longitudinal direction L and the lateral direction A. The inner end 514e can define the mating interface 506, and the outer end 514f can define a mounting interface 508 of the second electrical connector 500. The second electrical connector 500 is configured to be mounted to the electrical component 600 at the mounting interface 508.

Accordingly, when the first and second electrical connectors 400 and 500 are mated to each other, such that the mating interface 406 of the first electrical connector 400 engages with the mating interface 506 of the second electrical connector 500 to place the respective arrays of electrical contacts 404 and 504 in electrical communication with each of the first and second electrical connectors 400 and 500 can operate to place the first printed circuit board 104 in electrical communication with the second printed circuit board 602.

Because the mating interface 406 of the first electrical connector 400 and the mating interface 506 of the second electrical connector 500, respectively, are oriented substantially parallel to the respective mounting interfaces 408 and 508, the first and second electrical connectors 400 and 500 can be referred to as vertical or mezzanine electrical connectors. However it should be appreciated that one or both of the first and second electrical connectors 400 and 500 can be otherwise constructed as desired, for instance as right-angle electrical connectors such that the respective mating interfaces are oriented substantially perpendicular to the respective mounting interfaces.

Further in accordance with the illustrated embodiment, the electrical contacts 404 of the first array 402 of electrical contacts 404 are arranged into at least two such as a plurality of rows that extend along a row direction R that can be defined by the longitudinal direction L and into at least two such as a plurality of columns that extend substantially perpendicular to the rows along a column direction C that can be defined by the lateral direction A. As illustrated, each row or electrical contacts 404 can intersect with every column of electrical contacts 404, and each column of electrical contacts can intersect with every row of electrical contacts 404. In this regard, it can be said that each of the at least two rows of electrical contacts 404 intersects each of the at least two columns of electrical contacts 404. Similarly, in accordance with the illustrated embodiment, the electrical contacts 504 of the second array 502 of electrical contacts 504 are arranged into at least two such as a plurality of rows that extend along a row direction R that can be defined by the longitudinal direction L and into at least two such as a plurality of columns that extend substantially perpendicular to the rows along a column direction C that can be defined by the lateral direction A. As illustrated, each row or electrical contacts 504 can intersect with every column of electrical contacts 504, and each column of electrical contacts can intersect with every row of electrical contacts 504. In this regard, it can be said that each of the at least two rows of electrical contacts 504 intersects each of the at least two columns of electrical contacts 504. The arrays 402 and 502, respectively, can define any number of columns and rows of electrical contacts 404 and 504, respectively, as desired as described herein. The rows and columns of the first and second electrical connectors 400 and 500 can be numerically and spatially identical to each other.

Referring also to FIGS. 6A-6B, each electrical contact 404 can have a contact body 405 that defines a mating end 416 that extends out from that mating interface 406, an opposed mounting end 418 that extends out from the mounting interface 408, and a lead portion 419 that extends between the mating end 416 and the mounting end 418. At least a portion of the contact body 405 of each electrical contact 404 can be curved between the mating and mounting ends 416 and 418, respectively, as it extends between the mating end 416 and the mounting end 418 along the transverse direction T. As described in U.S. Pat. No. 6,042,389, which is incorporated by reference as if set forth in its entirety herein, each of the electrical contacts 404 can be a receptacle contact that include a base 404a, and a pair of cantilevered spring arms, including a first spring arm 404b and a second spring arm 404c that each extends from the base 404a along the transverse direction T toward the inner end 414e, such that the mounting end 418 extend from the base 404a toward the outer end 414f. Each spring arm 404b and 404c can be resiliently supported by the base 404a, and can extend from the base 404a to a respective free distal tip 420. The base 404a can be defined by the lead portion 419.

Each of the first cantilevered spring arm 404b and the second cantilevered spring arm 404c of each electrical contact 404 can be offset from each other both along the row direction R, such that each electrical contact defines a gap between the spring arms 404b and 404c along the row direction R. The spring arms 404b and 404c can further be spaced from each other along the column direction C. For instance, each spring arm 404b and 404c can further define a curved region between the base 404a and the respective distal tip 420, for instance a region of generally "S" shaped curvature. Thus, the tip 420 of each spring arm 404b and 404c is offset along the longitudinal direction L with respect to the mounting end 418. One of the spring arms 404b and 404c can be curved such that the distal tip 420 is offset toward one of the first side 414a or the second side 414b with respect to the mounting end 418, and the other of the spring arms 404b and 404c can be curved such that the distal tip 420 is offset toward the other of the first side 414a or the second side 414b with respect to the mounting end 418. The first and second spring arms 404b and 404c are configured to flex with respect to the base 404a away from each other when a plug mating end, for instance of the second electrical connector 500 is inserted between the spring arms 404b and 404c along the column direction C.

The electrical contacts 404 can further include respective solder balls 422 that project out from the mounting end 418 proximate to the mounting interface 408. The solder balls 422 can be attached or otherwise supported by the mounting ends 418, for instance fused to the mounting end 418, and are configured to be mounted to the electrically conductive contact pads 108 of the printed circuit board 104, for instance by positioning the first electrical connector 400 on the first printed circuit board 104 and subjecting the first electrical connector 400 and the first printed circuit board 104 to a solder reflow process whereby the solder balls 422 fuse to the respective ones of the contact pads 408 of the first printed circuit board 104. The solder balls 422 can all be co-planar with each other along the mounting interface 408, both before and after the solder reflow process is completed. It should further be appreciated that the electrical contacts 404 are not limited to the illustrated mounting ends 418, and that the mounting ends 418 can be alternatively configured with any other suitable fusible or non-fusible element as desired, such as press-fit mounting tails configured to be inserted into complementary vias of the first printed circuit board 104.

The first electrical connector 400 can define a plurality of pockets 424 that extend into the housing body 414 along the transverse direction T. For instance, the pockets 424 can extend into the outer end 414f of the housing body 414 of the connector housing 412 along the transverse direction T toward the inner end 414e. The mounting ends 418 of the contact body 405 can extend into the pockets 424, such that the solder balls 422 are disposed in respective ones of the pockets 424. Accordingly, the mounting ends of each of the electrical contacts 404, which can include the mounting ends 418 of the contact body 405 and the respective solder ball 422 can be at least partially disposed in the pockets 424. Thus, when the first array 402 of electrical contacts 404 is supported by the connector housing 412, each solder ball 422 is at least partially recessed with respect to the outer end 414f of the housing body 414, in a respective one of the plurality of pockets 424. In this regard, it can be said that the solder balls 422 of the first array 402 of electrical contacts 404 protrude out with respect to the outer end 414f of the housing body 414.

With continuing reference to FIGS. 6A-6B, the connector housing 412 can further define a plurality of retention apertures that extend through the housing body 414 along the transverse direction T from the inner end 414e of the housing body 414 of the connector housing 412 to the outer end 414f of the housing body 414. The retention apertures can include retention cavities 426 that extend into the inner end 414e of the housing body 414 of the connector housing 412 along the transverse direction T, and the plurality of pockets 424 that are substantially aligned with the retention cavities 426 along the transverse direction T. The retention cavities 426 can be configured to at least partially receive a respective retention portion of the electrical contacts 404, such that when the first array 402 of electrical contacts 404 is supported by the connector housing 412, the mating end 416 of each electrical contact 404 protrudes out with respect to the inner end 414e of the housing body 414. Each retention cavity 426 can be at least partially defined by at least one inner wall 427. Further, each retention cavity 426 can be at least partially defined by a shelf 427a that extends in from the inner walls 427 at a location between the inner end 414e and the outer end 414f. Each shelf 427a can be substantially parallel to the inner end 414e and the outer end 414f. The pockets 424 can be disposed between the shelf 427a and the outer end 414f. The connector housing 412 can define a height H3 along the transverse direction T from the inner end 414e to the outer end 414f from 0.3 mm to 0.7 mm, for instance 0.5 mm. The connector housing 412 can define a height H4 along the transverse direction T from the inner end 414e to the shelf 427a from 0.2 mm to 0.4 mm, for instance 0.3 mm.

The electrical contacts 404 can include broadsides 475a and edges 475b as defined above with respect to the electrical contacts 104. The electrical contacts 404 can further include a retention portion that includes at least one retention wing 415, for instance first and second opposed retention wings 415 that project out from opposed sides of the base 404a, for instance along the row direction R. Thus, the retention wings 415 that project out from opposed sides of the base 404a in opposite directions along a first direction that separates opposed edges of the electrical contacts 404. The retention wings 415 can extend to a location outboard of both the base 404a portion and the respective ones of the first and second spring arms 404b and 404c. The retention wings 415 can project out to respective free distal tips 415a that are spaced from each other connector a distance along a select direction that is slightly greater than the cross-sectional dimension of the retention cavity 426 along the select direction. Accordingly, the retention wings 415 can be press-fit against the at least one inner wall 427 so as to retain the electrical contact 404 in the connector housing 412. Thus, in accordance with one embodiment, the electrical contacts 404 touch the connector housing 412 at only two locations, defined by respective abutments between the retention wings 415 and the at least one inner wall 427. Further, as illustrated in FIG. 6B, the broadsides of the electrical contacts 404 are spaced from the at least one inner wall 427, along a second direction that separates the opposed broadsides, along an entirety of a length between the opposed retention wings 415 along the first direction that separates the opposed edges. Further, the broadsides can be continuous from one of the retention wings 415 to the other of the retention wings, and from each of the spring arms 404b and 404c to the mounting end 418. Moreover, the electrical contacts 404 can be devoid of enclosed apertures that extend through the contact body 405 from one broadside to the other broadside. Because wicking of solder flux during the solder reflow operation is directed toward contact locations between the contact body 405 and the connector housing 412, the electrical contacts are configured such that any wicking will occur between the retention wings 415 and the connector housing 412, which is offset from a data flow path between the mounting end 418 and each of the spring arms 404b and 404c. Thus, the data flow path is substantially devoid of wicked solder flux. Furthermore, because the contact body is substantially planar in the cavity 424, the solder is able to substantially fill the cavity 424 during the solder reflow operation. Each electrical contact 404 can define a thickness in the longitudinal direction L of approximately 0.1 mm. Thus, the opposed broadsides of each electrical contact 404 can be spaced from each other a distance of approximately 0.1 mm. The thickness can be defined by the sheet of material that forms the electrical contacts 404 before the electrical contacts are stamped or otherwise cut from the sheet of material. Each of the retention wings 415 can be curved. For instance, each of the retention wings 415 can be defined by a radius. For instance, each of the retention wings 415 can be defined by a radius of approximately 0.6 mm. Each of the retention wings 415 can define a contact area defined at a location where the retention wing 415 abuts the connector housing 412. The contact area can thus be defined by the thickness of the electrical contact 404 in the longitudinal direction L and a contact height dimension along the transverse direction T, from 0.01 mm to 0.15 mm, of the electrical contact at the retention wings 415 that are in physical contact with the connector housing. For instance, the contact height dimension of each wing 415 can be 0.06 mm. Thus, the contact area can be between 0.001 mm squared and 0.015 mm squared, such as 0.012 mm squared. One or both of the connector housing 412 and the electrical contact, at the wings 415, can deform when the electrical contacts 404 are mounted in the connector housing 412 to define the contact height dimension. Without being bound by theory, it is believed that the reduction of a cumulative contact area defined by all of the electrical contacts 404 and the connector housing 412 is reduced with respect to conventional electrical connectors, which correspondingly reduces internal forces applied by the electrical contacts 404 to the connector housing 412 that might otherwise cause the connector housing 412 to deform, particularly the inner and outer ends 414e and 414f, during the solder reflow operation. The reduction of internal forces thus allows the connector housing 414 to have a reduced height along the transverse direction with respect to conventional connector housings 414 while maintaining the planarity of the inner and outer ends 414e and 414f, and further maintaining the co-planarity of the solder balls 422.

Referring now also to FIGS. 7A-7B, each of the electrical contacts 504 can have a contact body 505 that defines a mating end 516 that extends out from that mating interface 506, an opposed mounting end 518 that extends out from the mounting interface 508, and a lead portion 519 that extends between the mating end 516 and the mounting end 518. As described in U.S. Pat. No. 6,042,389, which is incorporated by reference as if set forth in its entirety herein. Each of the electrical contacts 504 can be configured as a plug contact. Thus, the mating end 516 can define a blade that is planar and is oriented to lies within a plane defined by the lateral direction A and the transverse direction T. The mating end 516 can define a distal tip 520 that is inline with the mounting end 518 along the transverse direction T. The mating end 516 can have a dimension in the lateral direction A that is greater than the gap that separates the first and second spring arms 404b and 404c.

The electrical contacts 504 can further include respective solder balls 522 that project out from the mounting end 518 proximate to the mounting interface 508. The solder balls 522 can be attached or otherwise supported by the mounting ends 518, for instance fused to the mounting end 518, and are configured to be mounted to corresponding electrical contacts, for instance electrically conductive contact pads of the second printed circuit board 602, for instance by positioning the first electrical connector 500 on the second printed circuit board 602 and subjecting the second electrical connector 500 and the second printed circuit board 602 to a solder reflow process whereby the solder balls 522 fuse to the respective contact pads of the second printed circuit board 602. The solder balls 522 can all be co-planar with each other along the mounting interface 508, both before and after the solder reflow process is completed. Thus, all of the solder balls 422 at the mounting ends of first electrical connector 400 are coplanar with each other in a first plane, both before and after the solder balls 422 are reflowed to the first printed circuit board 104 so as to mount the first electrical connector 400 to the first printed circuit board 104. Similarly, all of the solder balls 522 at the mounting ends of the second electrical connector 500 are coplanar with each other in a second plane, both before and after the solder balls 522 are reflowed to the second printed circuit board 602 so as to mount the second electrical connector 500 to the second printed circuit board 602. The first plane can be parallel with the second plane. It should further be appreciated that the electrical contacts 504 are not limited to the illustrated mounting ends 518, and that the mounting ends 518 can be alternatively configured with any other suitable fusible or non-fusible element as desired, such as press-fit mounting tails configured to be inserted into complementary vias of the second printed circuit board 602.

The second electrical connector 500 can define a plurality of pockets 524 that extend into the housing body 514 along the transverse direction T. For instance, the pockets 524 can extend into the outer end 514f of the housing body 514 of the connector housing 512 along the transverse direction T toward the inner end 514e. The mounting ends 518 of the contact body 505 can extend into the pockets 524, such that the solder balls 522 are disposed in respective ones of the pockets 524. Accordingly, the mounting ends of each of the electrical contacts 504, which can include the mounting ends 518 of the contact body 505 and the respective solder ball 522 can be at least partially disposed in the pockets 524. Thus, when the first array 502 of electrical contacts 504 is supported by the connector housing 512, each solder ball 522 is at least partially recessed with respect to the outer end 514f of the housing body 514, in a respective one of the plurality of pockets 524. In this regard, it can be said that the solder balls 522 of the first array 502 of electrical contacts 504 protrude out with respect to the outer end 514f of the housing body 514.

With continuing reference to FIGS. 7A-7B, the connector housing 512 can further define a plurality of retention apertures that extend through the housing body 514 along the transverse direction T from the inner end 514e of the housing body 514 of the connector housing 512 to the outer end 514f of the housing body 514. The retention apertures can include retention cavities 526 that extend into the inner end 514e of the housing body 514 of the connector housing 512 along the transverse direction T, and the plurality of pockets 524 that are substantially aligned with the retention cavities along the transverse direction T. Each of the retention cavities 526 and can be configured to at least partially receive a respective retention portion of the electrical contacts 504, such that when the first array 502 of electrical contacts 504 is supported by the connector housing 512, the mating end 516 of each electrical contact 504 protrudes out with respect to the inner end 514e of the housing body 514. Each retention cavity 526 can be at least partially defined by at least one inner wall 527. Further, each retention cavity 526 can be at least partially defined by a shelf 527a that extends in from the inner walls 527 at a location between the inner end 514e and the outer end 514f. Each shelf 527a can be substantially parallel to the inner end 514e and the outer end 514f. The pockets 524 can be disposed between the shelf 527a and the outer end 514f. The connector housing 512 can define a height H5 along the transverse direction T from the inner end 514e to the outer end 514f from 0.2 mm to 0.6 mm, for instance 0.4 mm. The connector housing 512 can define a height H6 along the transverse direction T from the inner end 514e to the shelf 527a from 0.2 mm to 0.4 mm, for instance instance 0.3 mm.

The electrical contacts 504 can include broadsides 575a and edges 575b as defined above with respect to the electrical contacts 204. The electrical contacts 504 can further include a retention portion that includes at least one retention wing 515, for instance first and second opposed retention wings 515 that project out from opposed sides of the lead portion 519, for instance along the row direction R. Thus, the retention wings 515 that project out from opposed sides of the base 504a in opposite directions along a first direction that separates opposed edges of the electrical contacts 504. The retention wings 515 can extend to a location outboard of one or both of the mating end 516 and the mounting end 518. The retention wings 515 can project out to respective free distal tips 515a that are spaced from each other connector a distance along a select direction that is slightly greater than the cross-sectional dimension of the retention cavity 526 along the select direction. Accordingly, the retention wings 515 can be press-fit against the at least one inner wall 527 so as to retain the electrical contact 504 in the connector housing 512. Accordingly, the retention wings 515 can be press-fit against the at least one inner wall 527 so as to retain the electrical contact 504 in the connector housing 512. Thus, in accordance with one embodiment, the electrical contacts 504 touch the connector housing 512 at only two locations, defined by respective abutments between the retention wings 515 and the at least one inner wall 527. Further, as illustrated in FIG. 7B, the broadsides of the electrical contacts 504 are spaced from the at least one inner wall 527, along a second direction that separates the opposed broadsides, along an entirety of a length between the opposed retention wings 515 along the first direction that separates the opposed edges. Because wicking of solder flux during the solder reflow operation is directed toward contact locations between the contact body 505 and the connector housing 512, the electrical contacts are configured such that any wicking will occur between the retention wings 515 and the connector housing 512, which is offset from a data flow path between the mating end 516 and the mounting end 518. Thus, the data flow path is substantially devoid of wicked solder flux. Furthermore, because the contact body is substantially planar in the cavity 524, the solder is able to substantially fill the cavity 524 during the solder reflow operation. Each electrical contact 504 can define a thickness in the longitudinal direction L of approximately 0.1 mm. Thus, the opposed broadsides of each electrical contact 504 can be spaced from each other a distance of approximately 0.1 mm. The thickness can be defined by the sheet of material that forms the electrical contacts 504 before the electrical contacts are stamped or otherwise cut from the sheet of material. Each of the retention wings 515 can be curved. For instance, each of the retention wings 515 can be defined by a radius. For instance, each of the retention wings 515 can be defined by a radius of approximately 0.6 mm. Each of the retention wings 515 can define a contact area defined at a location where the retention wing 515 abuts the connector housing 512. The contact area can thus be defined by the thickness of the electrical contact 504 in the longitudinal direction L and a contact height dimension along the transverse direction T, from 0.01 mm to 0.15 mm, of the electrical contact at the retention wing 515 that is in physical contact with the connector housing. For instance, the contact height dimension of each wing 415 can be 0.06 mm. Thus, the contact area can be between 0.001 mm squared and 0.015 mm squared, such as 0.012 mm squared. One or both of the connector housing 512 and the electrical contact, at the retention wings 515, can deform when the electrical contacts 504 are mounted in the connector housing 512 to define the contact height dimension. Without being bound by theory, it is believed that the reduction of a cumulative contact area defined by all of the electrical contacts 504 and the connector housing 512 is reduced with respect to conventional electrical connectors, which correspondingly reduces internal forces applied by the electrical contacts 504 to the connector housing 512 that might otherwise cause the connector housing 512 to deform, particularly the inner and outer ends 514e and 514f, during the solder reflow operation. The reduction of internal forces thus allows the connector housing 512 to have a reduced height along the transverse direction T with respect to conventional connector housings 512 while maintaining the planarity of the inner and outer ends 514e and 514f, and further maintaining the co-planarity of the solder balls 522.

Each of the first and second electrical connectors 400 and 500 can include at least one alignment member configured to engage each other so as to ensure that the respective electrical contacts 404 and 504 are aligned to be mated when the first and second electrical connectors 400 and 500 are mated with each other along the mating direction M. Each of the first and second electrical connectors 400 and 500 can further include at least one orientation member orientation member configured to engage each other only when the first and second electrical connectors 400 and 500 are in a predetermined orientation with relative to each other, thereby ensuring the relative orientation when the first and second electrical connectors 400 and 500 are mated to each other. For instance, accordance with one embodiment, the first electrical connector 400 can include at least one recess, such as a first recess 455a and a second recess 455b that extend at least into the connector housing 412, from the inner end 414e toward the outer end 414f, for instance from the inner end 414e to the outer end 414f. The first recess 455a can be disposed at the first side 414a of the connector housing 412, and the second recess 455b can be disposed at the second side 414b of the connector housing 412. The recesses 455a and 455b can define different lengths along the longitudinal direction L.

The second electrical connector 500 can include at least one protrusion such as a first protrusion 555a and a second protrusion 555b that extend out from the inner end 514e along the transverse direction T. The first protrusion 555a can be disposed at the first side 514a and the second protrusion 555b can be disposed at the second side 514b. The first protrusion 555a can defined a length along the longitudinal direction sized to be received in the first recess 455a. The second protrusion 555b can be split so as to defined two second protrusion portions, or can be a single continuous structure, and can define a length along the longitudinal direction L sized to be received in the second recess 455b, and sized greater than that of the first recess 455a, Thus, the first and second electrical connectors 400 and 500 are only able to mate with each other when the first protrusion 555a is aligned with the first recess 455a, and the second protrusion 555b is aligned with the second recess 455b. It should be appreciated that the first and second electrical connectors 400 and 500 can include any suitable alternative alignment member as desired. For instance, the first electrical connector 400 can include one or more projections and the second electrical connector 500 can include one or more recesses.

Referring now also to FIGS. 5A-5B and 8A-8B, the mating ends 516 of the electrical contacts 504 are aligned with the mating ends 416 of the respective electrical contacts 404 so as to be inserted between the respective spring arms 404b and 404c along the column direction C when the first and second electrical connectors 400 and 500 are mated with each other. The spring arms 404b and 404c are elastically flexible and resilient so as to deflect away from each other about the base 404a along the column direction C as the mating ends 416 are inserted therebetween. The resiliency of the spring arms 404b and 404c defines a normal spring force against the mating end 516 that is inserted between the spring arms 404b and 404c. Because the mating ends 516 define a length along the row direction greater than that gap between the adjacent spring arms 404b and 404c, the mating ends 516 define first and second contact locations C1 and C2 with the first and second spring arms 404b and 404c, respectively. The first and second contact locations C1 and C2 can be disposed on opposed sides of the mating ends 516. For instance, the first and second contact locations C1 and C2 can be disposed on opposed broadsides of the electrical contacts 504. Thus, each of the electrical contacts 404 are placed in physical and electrical contact with a respective one of the electrical contacts 504, and each of the electrical contacts 504 are placed in physical and electrical contact with a respective one of the electrical contacts 404. The mating ends 416 of the electrical contacts 404 of the first electrical connector 400 can be configured as receptacle mating ends that are configured to receive complementary mating ends of the electrical contacts 504 of the second electrical connector 500 as described above, so as to mate with the electrical contacts 504. In this regard, the first electrical connector 400 can be referred to as a receptacle electrical connector, and the second electrical connector 500 can be referred to as a header electrical connector. However it should be appreciated that the first and second electrical connectors 400 and 500, respectively, are not limited to the illustrated mating ends, and that the electrical contacts of one or both of the first and second electrical connectors 400 and 500 can be alternatively be configured with any other suitable mating ends as desired. For instance, the electrical contacts of the first electrical connector 400 can be configured as header contacts as described herein with respect to the second electrical connector 500. Further, the electrical contacts of the second electrical connector 500 can be configured as receptacle contacts as described herein with respect to the first electrical connector 400.

When the first and second electrical connectors 400 and 500 are fully mated to each other, the electrical connectors 400 and 500 can combine to define a stack height within a range having a lower end between and including approximately 1 mm and approximately 2 mm, and increments of 0.1 mm therebetween. The range can have an upper end between and including approximately 2 mm and approximately 4 mm, and increments of 0.1 mm therebetween. For instance, the stack height can be approximately 2 mm. The stack height can further be approximately 3 mm. The stack height can be defined by a distance along the transverse direction T between respective locations on the solder balls 422 of the electrical contacts 404 that are spaced furthest from the inner end 414e of the housing body 414 of the connector housing 412 and respective locations on the solder balls 522 of the electrical contacts 504 that are spaced furthest from the inner end 514e of the housing body 514. Otherwise stated, the stack height can be defined by opposed outermost ends, along the transverse direction T, of the solder balls 422 of the first electrical connector 400 and solder balls 522 of the second electrical connector 500. While the first electrical connector 400 can be mounted to the first printed circuit board 104 and the second electrical connector 500 can be mounted to the second printed circuit board 602 as illustrated in FIG. 1, it should be appreciated that the second electrical connector 500 can alternatively be mounted to the first printed circuit board 104 and the first electrical connector 400 can alternatively be mounted to the second printed circuit board 602.

Referring again to FIGS. 1-2E, the first and second surfaces 106a and 106b can further support the second and third pluralities of electrical contact pads 116 and 117, respectively. Each of the pluralities of contact pads 116 and 117 can be configured to electrically connect to respective ones of the cables 300. Thus, the electrical conductors of the electrical cables 300 do not physically touch the contact pads 108. The contact pads 116 and 117 are in electrical communication with the one or more of the electrical traces of the first printed circuit board 104, which in turn are in electrical communication with respective ones of the first plurality of contact pads 108, as described above. Accordingly, the electrical cables 300 mounted to respective ones of the contact pads 116 and 117 are placed into electrical communication with respective ones of the contact pads 108. In particular, each of the electrical cables 300 can define mounting ends 301 that are configured to be mounted to respective ones of the contact pads 116 and 117.

In accordance with the illustrated embodiment, each of the first and second pluralities of electrical contact pads 116 and 117 may include a plurality of signal contact pads 119, a plurality of ground contact pads 121, and a tow speed cable contact pad 123. Signal contact pads 119, ground contact pads 121, and low speed cable contact pad 123 may be arranged in rows R1 and R2. Within rows R1 and R2, signal contact pads 119 and ground contact pads 1 may be in a repeating signal-signal-ground pattern, a ground-signal-signal pattern, or a signal-ground-signal pattern. Signal contact pads 119 and ground contact pads 121 may also define a repeating signal-signal-ground-ground pattern, a ground-signal-signal-ground pattern, or a signal-ground-signal-ground pattern.

Figure 9A:
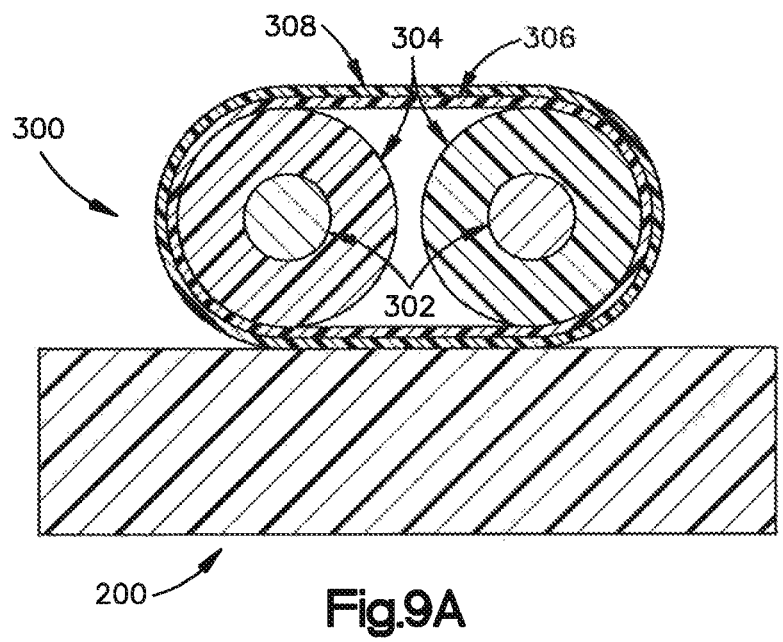
FIG. 9A is a sectional end elevation view of one of the plurality of electrical cables illustrated in FIG. 1, constructed in accordance with one embodiment.

The signal contact pads 119, ground contact pads 121, and low speed cable contact pads 123 may be in electrical communication with respective ones of the first plurality of contact pads 108. Referring also to FIG. 9A, each of the cables 300 can each include at least one electrical conductor 302, which can include a pair of signal carrying conductors 302, and an electrically insulative layer 304 that surrounds each of the pair of signal carrying conductors 302. Adjacent ones of the signal carrying conductors 302 can define differential signal pairs of signal carrying conductors 302. The electrically insulative layers 304 of each cable can reduce the crosstalk imparted by one of the signal carrying conductor 302 of the cable 300 to the other of the signal carrying conductors 302 of the cable 300. Each of the cables 300 can further include an electrically conductive ground jacket 306 that surrounds the respective insulated layer 304 of the signal carrying conductors 302. The ground jacket 306 may further reduce crosstalk. The ground jacket 306 may be configured to be electrically connected to a respective ground plane of a complementary electrical component to which the cable 300 is mounted. For example, in accordance with the illustrated embodiment, a ground jacket 306 of a respective cable 300 may be configured to be placed in electrical communication with a ground contact pad 121 of the printed circuit board 304. In this regard, the ground jacket 306 can provide an electrical path to ground, or ground path from the ground jacket 306 of the respective cable 300 to the respective around plane of the complementary electrical component. Each of the cables 300 can further include an outer layer 308 that is electrically insulative and surrounds the respective ground jacket 306. The outer layer 308 can reduce the crosstalk imparted by the respective cable 300 to another one of the cables 300. The insulative layers 304 and 308 can be constructed of any suitable dielectric material, such as plastic. The conductors 302 can be constructed of any suitable electrically conductive material, such as copper.

Figure 9B:
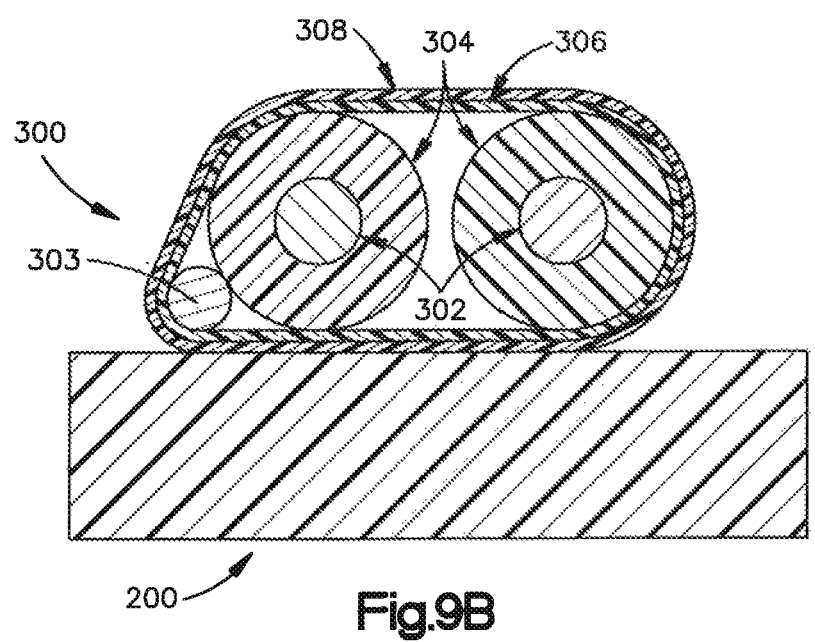
FIG. 9B is a sectional end elevation view of one of the plurality of electrical cables illustrated in FIG. 1, constructed in accordance with another embodiment.

In accordance an embodiment depicted in FIG. 9B, each of the electrical cables 300 may further include at least one ground conductor 309, which can be configured as a drain wire. The ground conductor 309 may be in electrical communication with the ground jacket 306. Thus, the ground jacket 306 can carry the ground conductor 309 that can also further define the electrical path to the ground plane. The ground conductors 309 can attach to respective ones of the ground contact pads 121 of the printed circuit board 304. The ground conductor 309 may be surrounded by the outer layer 308. The ground conductor 309 may also be surrounded by the ground jacket 306, when the ground jacket 306 is present.

In one embodiment, the electrical cables 300 can further include further include at least one low speed electrical cable 303. The low speed cables 303 may be a clock wire or carry signals to confirm an action has been taken. As described above, the low speed cable 303 may include an electrical conductor 302, electrically insulative layers 304 and 308, as well as a ground jacket 306. Further, the low speed electrical cable 303 may further include a ground conductor as desired, which can be coupled to the ground jacket 306 as described above.

The electrical cables 300 can include a first plurality of electrical cables 300a (see FIG. 1) that are configured to mount to the contact pads 316, for instance at their respective mounting ends 301. The electrical cables 300 can further include a second plurality of electrical cables 300b (see FIG. 1) that are configured to mount to the contact pads 317, for instance at their respective mounting ends 301.

Each of the first and second pluralities of cables 300a and 300b can be mounted to the printed circuit board 104 in a variety of ways. For instance, a portion of the insulative layers 304 and 308 and the ground jacket 306 of each cable 300 can be removed from the respective conductor 302 at the end 301 so as to expose the conductors 302. Alternatively, the cable 300 can be manufactured such that the conductors 302 extend longitudinally out from the insulating layers 304 and 308 and the ground jacket 306 so as to expose the mounting ends 301 of the electrical conductors 302. The exposed mounting ends 301 can be mounted to respective contact pads, for example by soldering the mounting ends 301 of the electrical conductors 302 to the contact pad. In one embodiment, the exposed mounting ends 301 of signal carrying conductors 302 may be mounted to respective ones of the signal contact pads 119. The mounting ends 301 of the ground conductors 309 may also be mounted to respective ones of the ground contact pads 121.

In accordance with the embodiments described above, ones of the second plurality of contact pads 116 may be offset along the lateral direction A alone or in combination with the longitudinal direction L. Further, the mounting ends 301 of the first plurality of cables 300a that are mounted to the second plurality of contact pads 116 may be offset in the lateral direction A, alone or in combination with the longitudinal direction L. It can thus be said that the ends 301 of the first plurality of electrical cables 300a can be offset, and in particular offset along the longitudinal direction L, the lateral direction A, or both the longitudinal direction L and the lateral direction A. Similarly, ones of the third plurality of contact pads 117 may be offset along the lateral direction A alone or in combination with the longitudinal direction L. Further, the mounting ends 301 of the second plurality of cables 300b that are mounted to the third plurality of contact pads 117 may be offset in the lateral direction A, alone or in combination with the longitudinal direction L. It can thus be said that the ends 301 of the second plurality of electrical cables 300b can be offset, and in particular offset along the longitudinal direction L, the lateral direction A, or both the longitudinal direction and the lateral direction A. By offsetting the ends 301 of the cables 300 relative to each other, cross talk between the cables of the first and second pluralities of cables 300a and 300b can be reduced.

Referring now to FIGS. 1A-2C, and as described above, the system housing 102 includes a retention member 115 that is configured to be attached to the housing body 120. The housing 102 is configured to capture the electrical cables 300 between the housing body 120 and the retention member 115 when the electrical cables are mounted to the printed circuit board 104 when the printed circuit board 104 is supported by the system housing 102. The retention member 115 defines a retention base 140 and a pair of retention arms 142 that extend out from the retention base 140. The retention member 115 can further include an attachment member that is configure attach the retention member 115 to the retention member of the housing body 120. For instance, the attachment member can be configured as a projection 143 that extends out from each of the retention arms 142, and is configured to be inserted into a respective one of the apertures 131 of the housing body 120. It should be appreciated, of course, that the attachment member of the housing body 120 can be configured as a projection, and the attachment member of the retention member 115 can be configured as an aperture that receives the projection to attach the retention member 115 to the housing body 120. The retention arms 142 are configured to be received in a gap between the rail 134 and the housing base 122 along the forward direction until the projection is inserted into the aperture so as to attach the retention member 115 to the housing body 120.

It should be appreciated that when the retention member 115 is mounted onto the housing body 120, the system housing 102 defines a cable retention cavity 144 that extends from the housing base 122 to the retention base 140 along the transverse direction T. The retention cavity 144 can further be defined from one of the retention arms 142 to the other of the retention arms 142 along the lateral direction A. Thus, after the electrical cables 130 have been mounted to the printed circuit board 104, and the printed circuit board 104 is supported by the housing body 120, at least a portion of the ground jackets 306, of the electrical cables is aligned with both the retention base 140 and the housing base 122 along the transverse direction T. Further, at least a portion of the outer electrically insulative layer 308 of the electrical cables 300 is aligned with both the retention base 140 and the housing base 122 along the transverse direction T. Accordingly, the retention member 115 can be attached to the housing body 120 so as to retain the electrical cables 130 in the retention cavity 144. It should be appreciated that the retention base 140 and the housing base 122 can compress the electrical cables 300, for instance the outer insulative layer 308 and/or ground jackets 306, along the transverse direction T when the retention member 115 is attached to the housing body 120. Further, the retention arms 142 can capture the electrical cables 130 along the lateral direction A as the electrical cables 130 are compressed along the transverse direction T. It should be appreciated that the retention member 115 provides strain relief to the electrical cables 300. For instance, if a tensile force is applied to the electrical cables 300 at a location such that the system housing 102 is disposed between the location and the mounting ends 301, the tensile force is absorbed by the system housing 102. Thus, the tensile force is not communicated to the interface between the mounting ends 301 and the respective contact pads.

Referring now again to FIGS. 1A-2C, various methods can be provided for making the electrical cable connector assembly 200. For example, the first electrical connector 400 can be mounted onto the printed circuit board 104 in order to individually, physically and electrically connect the electrical contacts 404 of the first electrical connector 202 to respective ones of the contact pads 108 of the printed circuit board 104. Respective electrical signal conductors of the electrical cables 300 can be connected to a respective at least one or more of the contact pads 316 and 317 so as to place the electrical signal conductors in electrical communication with the electrical traces of the printed circuit board 104, and thus in electrical communication with the electrical signal contacts of the first electrical connector 40-. Thus, the electrical signal conductors are placed in electrical communication with the electrical contacts 504 of the second electrical connector 500 when the first electrical connector 400 is mated with the second electrical connector 500 in the manner described above. According to an embodiment, the electrical signal conductors of the electrical cables 300 may be placed in electrical communication with respective ones of the electrical traces of the printed circuit board 104 at a connection location that is spaced from the electrical signal conductor and each of the contact pads 108. The connection location can be defined by respective ones of the contact pads 316 and 317.

The method may also inserting the printed circuit board 104 into the housing body 120 through the first longitudinal end 127a along the forward direction such that the printed circuit board 104 is supported by the rails 134 and the ledge 130. Thus, at least a portion of the housing body 120, such as the base 122, is aligned with the connection location, which can be defined by one or both pluralities of the contact pads 316 and 317, along the transverse direction T. Alternatively, the method can include the step of overmolding the housing body 120 onto a portion of the printed circuit board 104. The method may further include electrically connecting a pair of electrical conductors of the electrical cables 300 to respective adjacent ones of the electrical traces 316 that are in electrical communication with respective ones of the contact pads 108. The method may further include electrically connecting a pair of electrical conductors of the electrical cables 300 to respective adjacent ones of the electrical traces 317 that are in electrical communication with respective ones of the contact pads 108.

In yet another embodiment, a method of fabricating the electrical connector system 10 may include providing or teaching to a third party the use of solid substrate body 106 comprising the first plurality of electrically conductive contact pads 108 and the second plurality of electrically conductive contact pads 116 individually and electrically connected to respective ones of the electrically conductive contact pads 108. The method may also include providing or teaching to a third party the use of the electrical connector 400 comprising electrical contacts 404. The method may further include providing or teaching to a third party the use of the electrical cable 300 including at least one electrical conductor. The method may also include teaching the step of mounting the electrical connector 400 to the solid substrate body 106 such that the electrical contacts 404 individually, physically and electrically connect to one or more of the first plurality of electrically conductive contact pads 108, and teaching the step of individually, physically and electrically attaching the at least one electrical conductor of the electrical cable 300 to a respective one of the second plurality of electrical contact pads 116. Further, the method may include selling to the third party the printed circuit board 104.

In yet another embodiment, a method of fabricating the electrical connector system 10 may include providing or teaching to a third party the use of solid substrate body 106 comprising the first plurality of electrically conductive contact pads 108 and the second plurality of electrically conductive contact pads 116 individually and electrically connected to respective ones of the first electrically conductive contact pads 108. The method can further include mounting the first electrical connector 202 to the printed circuit board 104, the first electrical connector 202 comprising electrical contacts individually, physically and electrically connected to one or more of the first plurality of electrically conductive contact pads 108. The method may also include providing or teaching to a third party the use of at least one of the electrical cables 300 including at least one electrical conductor. The method may further include teaching the step of attaching the at least one of the electrical cables 300 including the at least one electrical conductor individually, physically and electrically to respective ones of the second plurality of electrically conductive contact pads 116. The method may further include selling to the third party the printed circuit board 104 with the electrical connector 400 and the at least one of the electrical cables 300 electrically connected thereto.

In yet another embodiment, a method of fabricating the electrical connector system 10 may include providing or teaching to a third party the use of solid substrate body 106 having the first plurality of electrically conductive contact pads 108 and the second plurality of electrically conductive contact pads 116 that are individually and electrically connected to respective ones of the first plurality of electrically conductive contact pads 108. The electrical connector system 10 may also have at least one cable 300 including at least one electrical conductor, individually, physically and electrically attached to respective ones of the electrically conductive traces. The method may also include the step of providing or teaching to a third party the use of the electrical connector 400 comprising electrical contacts 404. The method may also include teaching the step of mounting the electrical connector 400 to the printed circuit board 104, such that the electrical contacts 404 are individually, physically and electrically connected to one or more of the second plurality of electrically conductive contact pads 116. The method may further include selling to the third party the printed circuit board 104 with the electrical connector 400 and the at least one of the electrical cables 300 electrically connected thereto.

Those skilled in the art will appreciate that numerous changes and modifications can be made to the preferred embodiments of the invention and that such changes and modifications can be made without departing from the scope of the invention. It is, therefore, intended that the appended claims cover all such equivalent variations as fall within the true spirit and scope of the invention.

What is claimed is:

1. An electrical cable connector assembly comprising:
   a housing;
   a printed circuit board including a body disposed within the housing, the printed circuit board comprising a first plurality of electrically conductive mounting locations supported by the body so as to define an array of electrically conductive mounting locations, and a second plurality of electrically conductive mounting locations supported by the body at a location spaced from the array of electrically conductive mounting locations, wherein respective ones of the second plurality of electrically conductive mounting locations are in electrical communication with respective ones of the first plurality of electrically conductive mounting locations;
   an electrical connector disposed within the housing and mounted to the printed circuit board, the electrical connector including a plurality of electrical contacts that are individually, physically and electrically connected to respective ones of the first plurality of electrically conductive mounting locations; and
   at least one electrical cable supported by the housing, the cable comprising at least one electrical signal conductor individually, physically and electrically attached to at least a respective one of the second electrically conductive mounting locations.

2. The electrical cable connector assembly as recited in claim 1, wherein the first plurality of mounting locations comprises a first plurality of electrically conductive contact pads, and the second plurality of mounting locations comprise electrically conductive contact pads.

3. The electrical cable connector assembly as recited in claim 2, wherein the at least one electrical signal conductor physically attaches directly to the respective one of the second electrically conductive contact pad and does not physically attach directly to any of the first plurality of electrically conductive contact pads.

4. The electrical cable connector assembly as recited in claim 2, wherein:
   the printed circuit board is substantially planar along a lateral direction and a longitudinal direction that is perpendicular to the lateral direction, the electrical cable connector assembly further comprising:
   the housing is an electrically insulative housing having a portion that is aligned with the second plurality of electrically conductive contact pads along a transverse direction that is perpendicular to both the lateral direction and the longitudinal direction.

5. The electrical cable connector assembly as recited in claim 4, wherein the at least one electrical cable includes a differential pair of electrical signal conductors each individually, physically and electrically attached to respective ones of the second plurality of electrically conductive contact pads.

6. The electrical cable connector assembly as recited in claim 2, body of the printed circuit board defines first and second opposed surfaces, and the first plurality of electrically conductive contact pads are supported by the first surface.

7. The electrical cable connector assembly as recited in claim 6, wherein the electrically conductive contact pads of the second plurality of electrically conductive contact pads are disposed on the first surface.

8. An electrical cable connector assembly comprising:
   a printed circuit board comprising:
     a body having a first surface and a second surface,
     a first plurality of electrically conductive contact pads on the first surface so as to define an array of electrically conductive mounting locations, and
     a second plurality of electrically conductive contact pads supported by the body at a location spaced from the array of electrically conductive mounting locations, wherein respective ones of the second plurality of electrically conductive contact pads are in electrical communication with respective ones of the first plurality of electrically conductive contact pads; and
     a third plurality of electrically conductive contact pads supported on the second surface, wherein respective ones of the third plurality of electrically conductive contact pads are in electrical communication with respective ones of the first plurality of electrically conductive contact pads;
   an electrical connector mounted to the printed circuit board, the electrical connector including a plurality of electrical contacts that are individually, physically and electrically connected to respective ones of the first plurality of electrically conductive contact pads; and
   at least one electrical cable including at least one electrical signal conductor individually, physically and electrically attached to at least a respective one of the second electrically conductive mounting locations.

9. The electrical cable connector assembly as recited in claim 8, further comprising an electrically insulative housing having a portion that is aligned with both the second plurality of electrically conductive contact pads and the third plurality of electrically conductive contact pads along a transverse direction that is perpendicular to both the lateral direction and the longitudinal direction.

10. The electrical cable connector assembly as recited in claim 9, wherein the at least one electrical cable includes a first plurality of electrical cables individually, physically and electrically connected to respective ones of the second plurality of electrical contact pads, and a second plurality of electrical cables individually, physically and electrically connected to respective ones of the third plurality of electrical contact pads.

11. The electrical cable connector assembly as recited in claim 10, wherein the electrically insulative housing comprises a housing body that supports the printed circuit board, and a retention member that is configured to attach to the housing body so as to apply a compressive force to the first and second plurality of electrical cables along the transverse direction.

12. The electrical cable connector assembly as recited in claim 8, wherein the second and third pluralities of electrical contact pads are arranged along the same edge of the printed circuit board.

13. The electrical cable connector assembly as recited in claim 2, wherein the second plurality of contact pads are arranged along an edge of the printed circuit board.

14. An electrical connector system comprising:
the electrical cable connector assembly as recited in claim 1, wherein the electrical connector is a first electrical connector; and
a second electrical connector including a second electrically insulative connector housing and a second plurality of electrical contacts supported by the second electrically insulative connector housing, wherein the second electrical connector is configured to mate with the first electrical connector so as to place the second plurality of electrical contacts in physical and electrical contact with respective ones of the plurality of electrical contacts of the first electrical connector.

15. The electrical connector system as recited in claim 14, wherein each of the electrical contacts of the first and second electrical connectors includes a mating end and an opposed mounting end supporting a fusible element.

16. The electrical connector system as recited in claim 15, wherein when the first and second electrical connectors are mated to each other each fusible element of the first electrical connector is spaced from a corresponding fusible element of the second electrical connector a distance of between 1 mm and 4 mm.

17. The electrical connector system as recited in claim 16, wherein the distance is approximately 2 mm.

18. A method of fabricating an electrical cable connector assembly, the method comprising the steps of:
mounting a vertical electrical connector to a printed circuit board, such that each of a plurality of electrical signal contacts of the vertical electrical connector are placed in physical and electrical connection with a respective one of a first plurality of electrically conductive pads of the printed circuit board;
electrically connecting an electrical conductor of an electrical cable to an electrically conductive contact pad of the printed circuit board that is in electrical communication with a respective one of the first plurality of electrically conductive contact pads, thereby placing the electrical conductor in electrical communication with a respective one of the electrical signal contacts of the vertical electrical connector;
enclosing the printed circuit board in a housing; and
attaching a retention member to the housing, thereby compressing the cable against the housing.

19. The method as recited in claim 18, wherein the electrically connecting step comprises electrically connecting a pair of electrical signal conductors of the cable to respective different electrically conductive traces of the solid substrate body that are each in electrical communication with a respective at least one of the first plurality of electrically conductive contact pads.

20. The method as recited in claim 18, further securing the printed circuit board in the housing.

21. The method as recited in claim 20, wherein:
the electrically connecting step further comprises placing a first plurality of electrical contacts of a plurality of electrical cables to a first plurality of electrical contact pads supported by a first surface of the printed circuit board, and placing a second plurality of electrical contacts of a plurality of electrical cables to a first plurality of electrical contact pads supported by a second surface of the printed circuit board that is opposite the first surface.

* * * * *